(12) United States Patent
Shimabukuro et al.

(10) Patent No.: US 9,356,074 B1
(45) Date of Patent: May 31, 2016

(54) MEMORY ARRAY HAVING DIVIDED APART BIT LINES AND PARTIALLY DIVIDED BIT LINE SELECTOR SWITCHES

(71) Applicant: SanDisk 3D LLC, Milpitas, CA (US)

(72) Inventors: Seiji Shimabukuro, Yokkaichi (JP);
Teruyuki Mine, Yokkaichi (JP);
Hiroyuki Ogawa, Nagoya (JP); Naoki Takeguchi, Nagoya (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/543,690

(22) Filed: Nov. 17, 2014

(51) Int. Cl.
*G11C 13/00* (2006.01)
*H01L 27/24* (2006.01)
*H01L 45/00* (2006.01)

(52) U.S. Cl.
CPC ........ *H01L 27/2481* (2013.01); *G11C 13/0069* (2013.01); *H01L 45/16* (2013.01); *G11C 2213/71* (2013.01)

(58) Field of Classification Search
CPC  H01L 27/2481; H01L 45/16; G11C 13/0069; G11C 2213/71
See application file for complete search history.

(56) References Cited

U.S. PATENT DOCUMENTS

| 7,808,815 | B2 | 10/2010 | Ro et al. | |
|---|---|---|---|---|
| 8,237,143 | B2* | 8/2012 | Toda | G11C 5/02 257/2 |
| 8,451,645 | B2 | 5/2013 | Yoon et al. | |
| 8,559,253 | B2 | 10/2013 | Kitagawa et al. | |
| 2010/0271867 | A1 | 10/2010 | Lee et al. | |
| 2011/0038197 | A1 | 2/2011 | Seol et al. | |
| 2012/0147644 | A1* | 6/2012 | Scheuerlein | G11C 13/0002 365/51 |
| 2012/0248399 | A1* | 10/2012 | Sasago | H01L 27/2409 257/4 |
| 2014/0248763 | A1* | 9/2014 | Konevecki | H01L 21/2808 438/591 |
| 2015/0162338 | A1* | 6/2015 | Nakada | H01L 27/115 438/268 |

* cited by examiner

*Primary Examiner* — Khamdan Alrobaie
(74) *Attorney, Agent, or Firm* — Vierra Magen Marcus LLP

(57) ABSTRACT

A non-volatile data storage device comprises pairs of immediately adjacent and isolated-from-one-another local bit lines that are independently driven by respective and vertically oriented bit line selector devices. The isolation between the immediately adjacent and isolated-from-one-another local bit lines also isolates from one another respective memory cells of the non-volatile data storage device such that leakage currents cannot flow from memory cells connected to a first of the immediately adjacent and isolated-from-one-another local bit lines to memory cells connected to the second of the pair of immediately adjacent and isolated-from-one-another local bit lines. A method programming a desire one of the memory cells includes applying boosting voltages to word lines adjacent to the bit line of the desired memory cell while not applying boosting voltages to word lines adjacent to the other bit line of the pair.

13 Claims, 30 Drawing Sheets

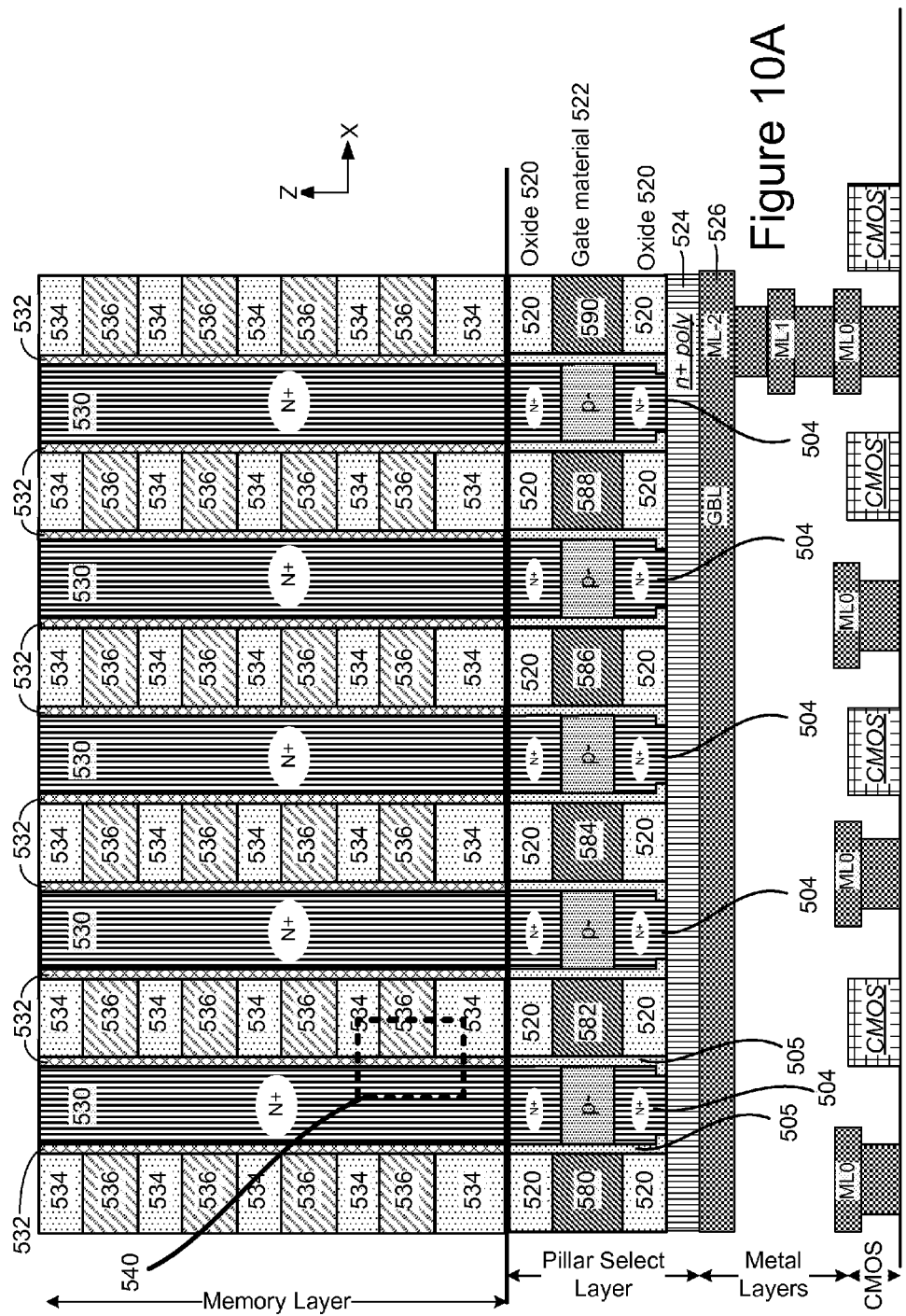

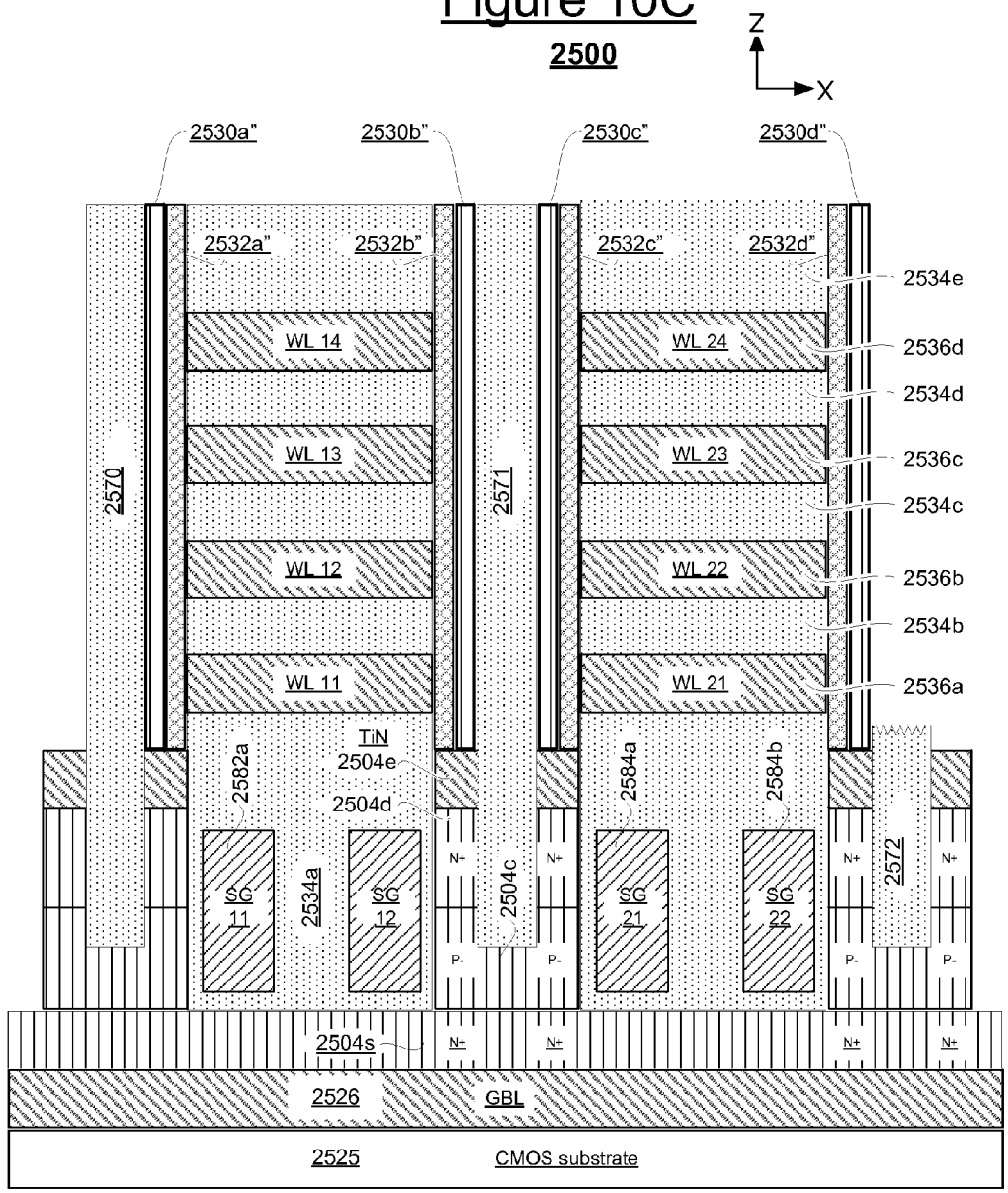

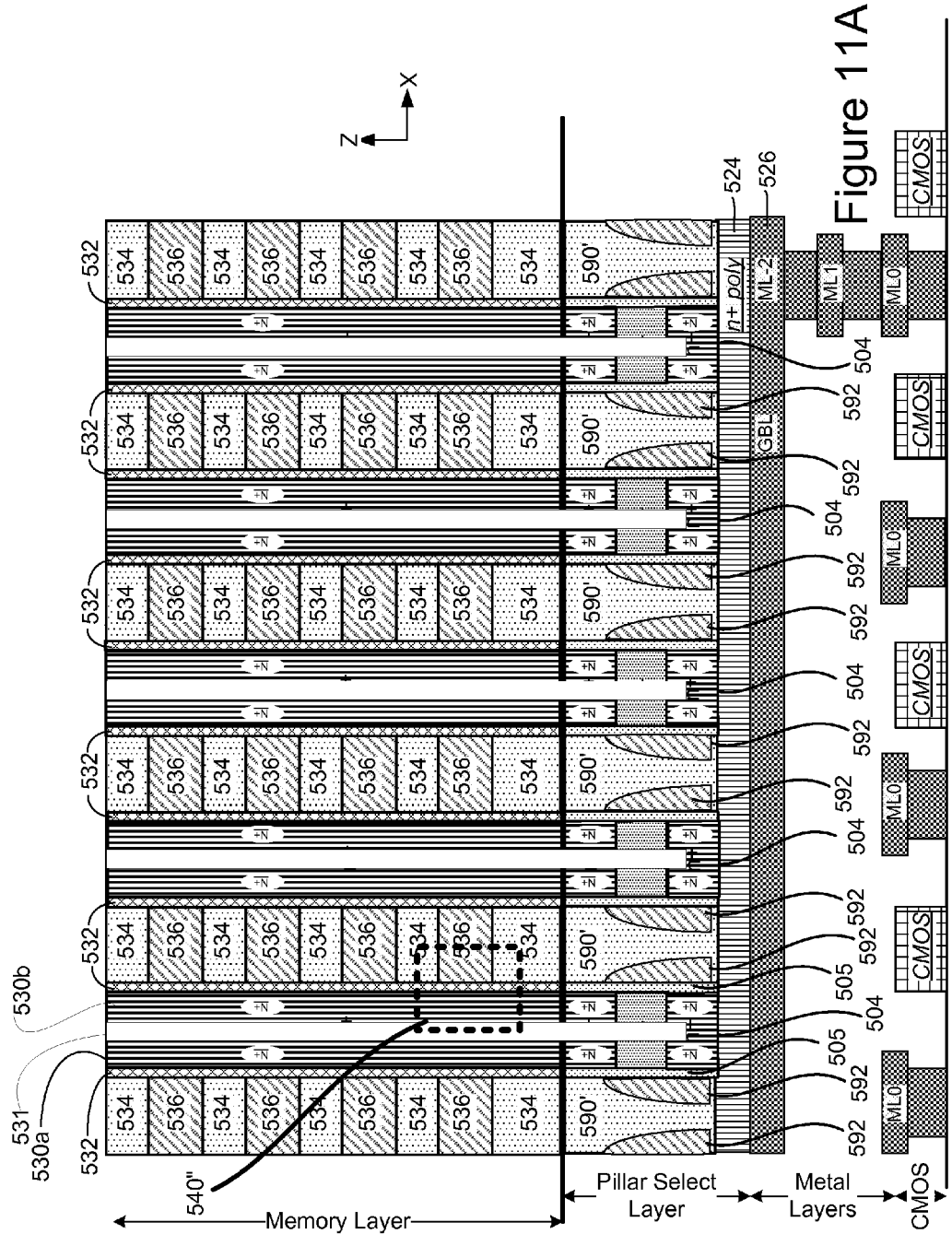

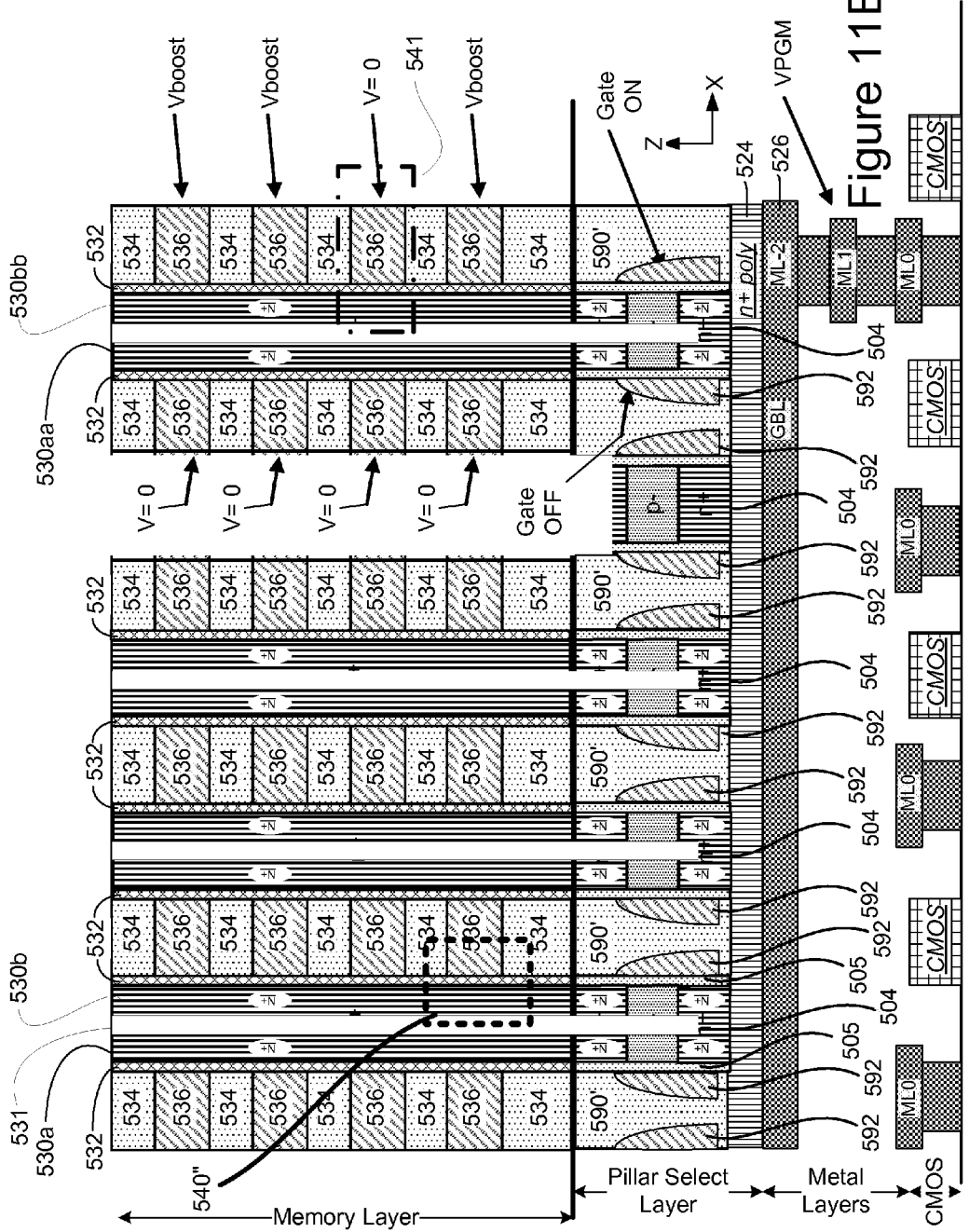

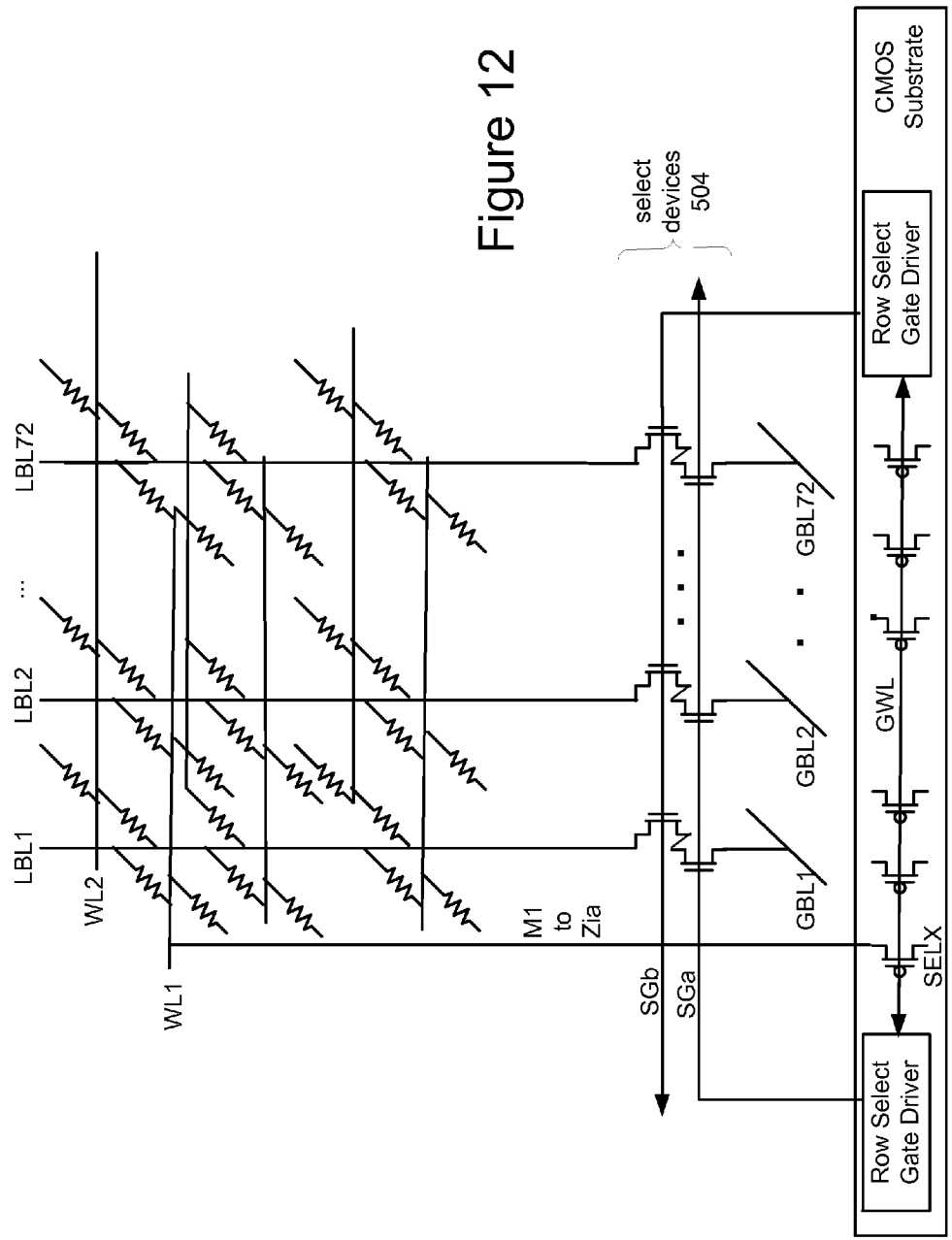

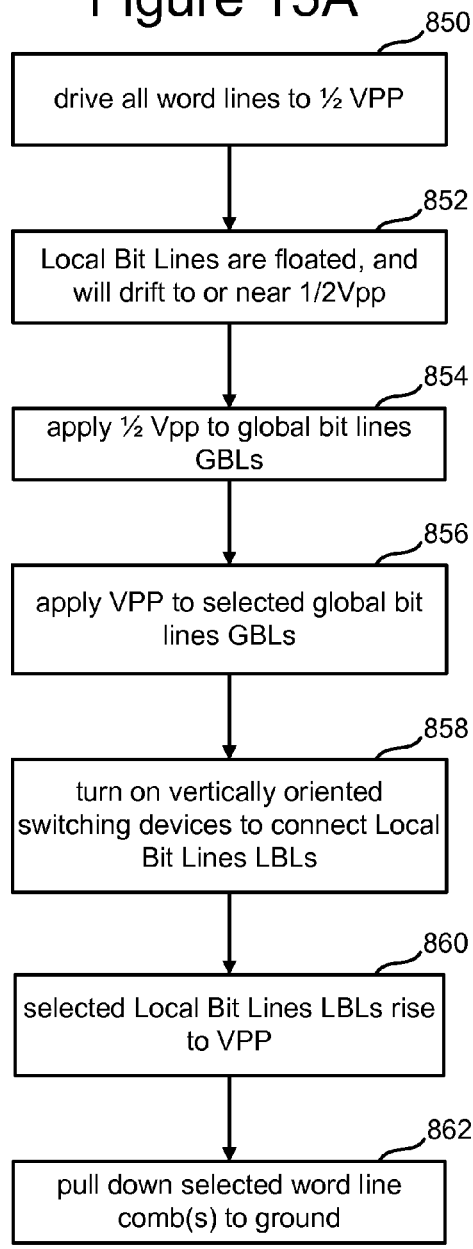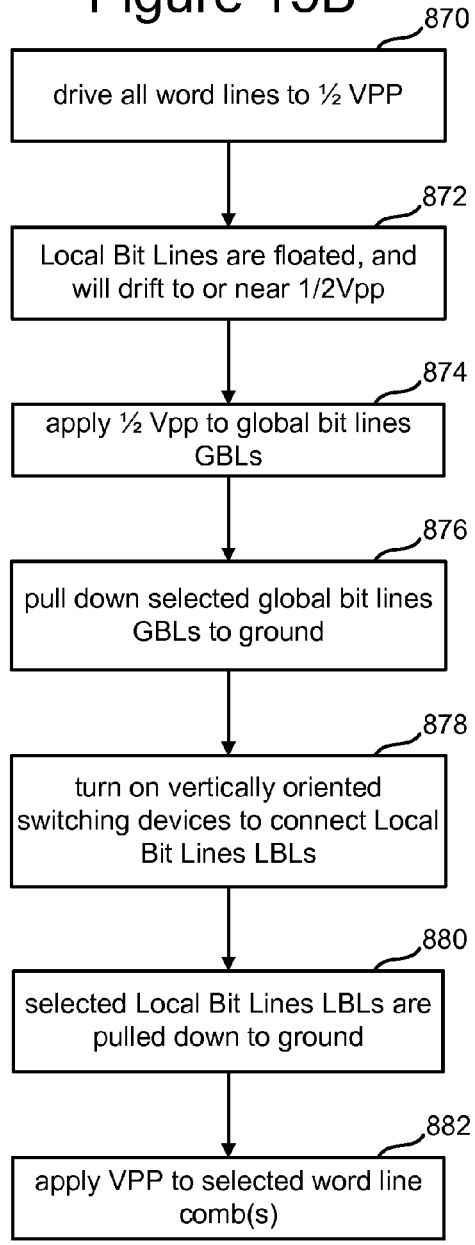

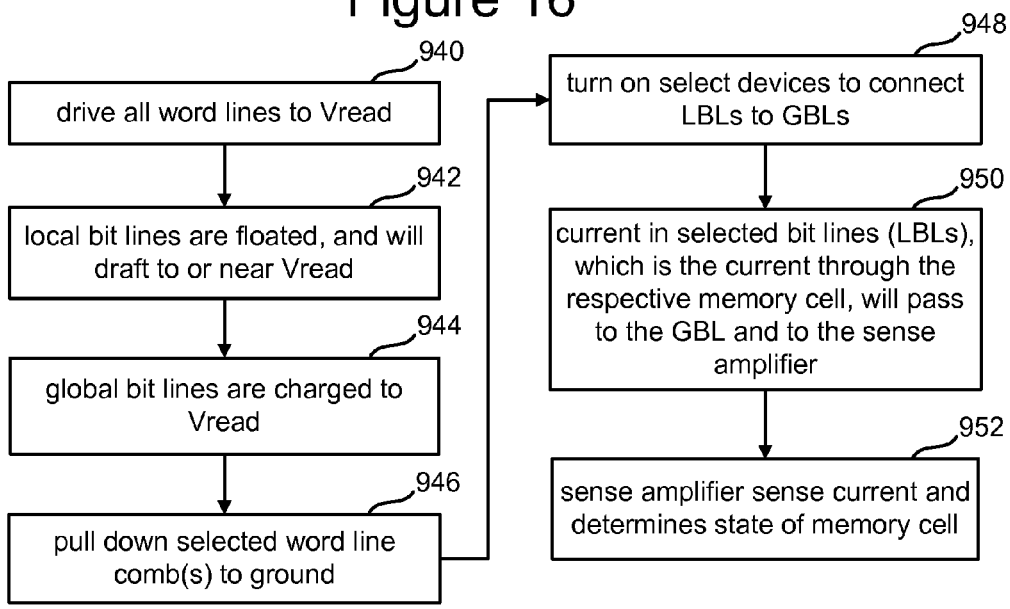

2000

2100a

2100b

2200a

2200b

2300a

2300b

MEMORY ARRAY HAVING DIVIDED APART BIT LINES AND PARTIALLY DIVIDED BIT LINE SELECTOR SWITCHES

BACKGROUND

1. Field of Disclosure

The present disclosure relates to apparatus and methods for non-volatile data storage.

2. Description of Related Technology

In three-dimensionally selectable memory arrays, it is desirable to minimize line resistances of lines that carry addressing signals and to maximize utilization of such lines, for example by sharing of resources in multiple directions.

One example of a three-dimensionally addressable array of non-volatile memory cells (a.k.a. non-volatile storage elements or "NVSE's") uses variable resistance memory elements. Each may be set to either a low or high resistance states and it (the variable resistance memory element) remains in that set state until subsequently re-set to the initial condition. The variable resistance memory elements are each connected between two orthogonally extending conductors (typically vertically extending, bit lines and horizontally extending word lines) where they cross each other in a three-dimensional array organized as stacked layers. The state of each such memory element is typically changed by proper voltages being placed on the intersecting conductors (on the bit lines and on the word lines). Since these voltages inherently spread along their respective bit lines and word lines so as to also be applied to a large number of other unselected memory elements (because they are connected along the same conductors as the selected memory elements being programmed or read), diodes are commonly connected in series with the variable resistive elements in order to reduce leakage currents that can flow through them. The desire to perform data reading and programming operations with a large number of memory elements in parallel results in reading or programming voltages being applied to a very large number of other memory elements. An example of an array of variable resistive elements and associated diodes is given in U.S. Patent Application Publication No. US 2009/0001344.

BRIEF DESCRIPTION OF THE DRAWINGS

FIG. 10A illustrates one embodiment of a memory structure in accordance with FIG. 1A having vertical local bit lines above the substrate and vertically oriented select devices above the substrate that connect the bit lines to global bit lines.

FIG. 10C illustrates another embodiment of a memory structure in accordance with FIG. 1B having vertical local bit lines above the substrate and vertically oriented select devices above the substrate that connect the bit lines to global bit lines.

FIG. 11A illustrates one embodiment of a memory structure with vertical local bit lines above the substrate and vertically oriented select devices above the substrate that connect the bit lines to global bit lines.

FIG. 11B is a schematic of a portion of the memory system of FIG. 11A, depicting a method of programming a desired memory cell.

FIG. 12 is a schematic of a portion of the memory system, depicting vertical bit lines, vertically oriented select devices above the substrate and row select line drivers in the substrate.

FIGS. 15A and 15B are flow charts describing embodiments for mono the memory system.

FIG. 16 is a flow chart describing one embodiment for reading the memory system.

DETAILED DESCRIPTION

Figure 1A:
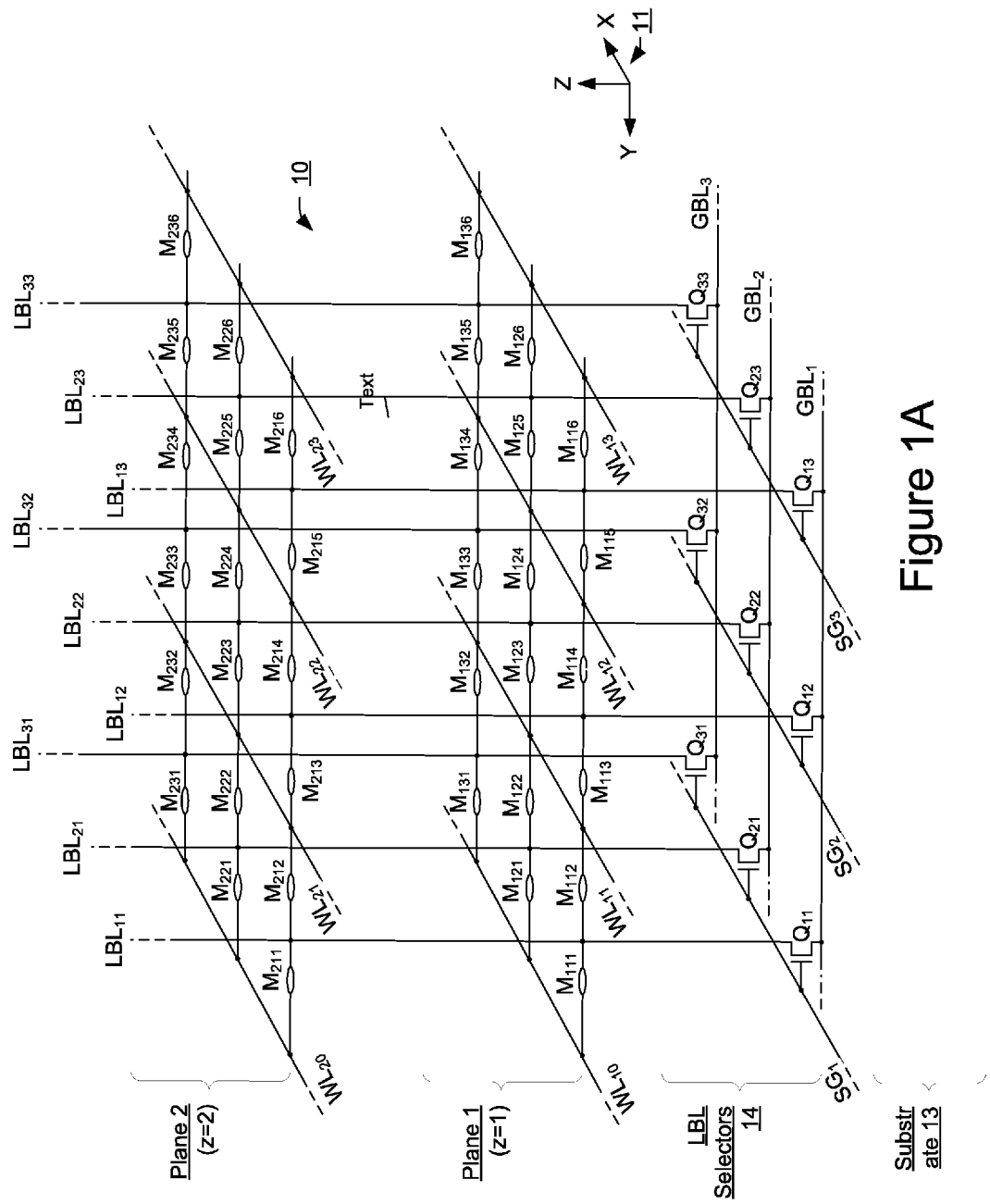
FIG. 1A is an equivalent circuit of a portion of an exemplary first three-dimensional array of variable resistance memory elements, wherein the array has vertically extending, local bit lines and horizontally extending word lines.

An exemplary non-volatile data storage device comprises: a substrate (e.g., one having semiconductive components monolithically integrated therein); a monolithic three dimensional array of memory cells positioned above and not in the substrate; a plurality of word lines connected to the memory cells; a plurality of global bit lines; a plurality of vertically oriented bit lines connected to the memory cells; and vertically oriented select devices that are above and not in the substrate. New structures are provided here for the vertically oriented select devices and the vertically oriented bit lines that reduce leakage current and reduce power consumption. The new structures provide isolation gaps as between adjacent bit lines so that leakage currents cannot flow from one of the adjacent bit lines to the other. A method in accordance with the disclosure includes not having to apply boost voltages to some of the word lines and thus saving on power consumption.

The memory elements used in the three-dimensional array may be variable resistance memory elements. That is, the resistance (and thus inversely the conductance) of the individual memory elements is typically changed as a result of a voltage placed across the orthogonally intersecting conductors to which the memory element is connected. Depending on the type of variable resistive element, the state may change in response to a voltage across it, a level of current through it, an amount of electric field across it, a level of heat applied to it, and the like. With some variable resistive element materials, it is the amount of time that the voltage, current, electric field, heat and the like is applied to the element that determines if and when its conductive state programmably changes and the direction in which the change takes place. In between such state changing operations, the resistance of the memory element remains unchanged, so it is non-volatile. The three-dimensional array architecture summarized above may be implemented with a memory element material selected from a wide variety of such materials having different properties and operating characteristics.

The resistance of the memory element, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change it in another direction. With at least two detectable and distinct states, each memory element can store at least one-bit of data. With use of some materials, more than one bit of data may be stored in each memory element by designating more than two stable levels of resistance as detectable and distinct states of the memory element. The three-dimensional array architecture herein is quite versatile in the way it may be operated.

This three-dimensional architecture also allows for limiting the extent and number of unaddressed (non-selected) resistive memory elements across which an undesired level of voltage is applied during a reading and/or programming operation conducted on an addressed (selected) one or more memory elements. The risk of disturbing the states of unaddressed memory elements and the levels of leakage currents passing through unaddressed elements may be significantly reduced from those experienced in other arrays using the same memory element material. Leakage currents are undesirable because they can alter the apparent currents being read from addressed memory elements, thereby making it difficult to accurately read the states of addressed (selected) memory elements. Leakage currents are also undesirable because they add to the overall power draw by an array and therefore undesirably causes the power supply to have to be made larger than is desirable. Because of the relatively small extent of unaddressed memory elements that have voltages applied during programming and reading of addressed memory elements, the array with the three-dimensional architecture disclosed herein may be made to include a relatively large number of addressed memory elements without introducing errors in reading and exceeding reasonable power supply capabilities.

In addition, the three-dimensional architecture disclosed herein allows variable resistance memory elements to be connected at orthogonal crossings of bit and word line conductors without the need for diodes or other non-linear elements being connected in series with the variable resistive elements. In existing arrays of variable resistance memory elements, a diode is commonly connected in series with each memory element in order to reduce the leakage current through the element when it is unselected but nevertheless has a voltage difference placed across it, such as can occur when the unselected memory element is connected to a bit or word line carrying voltages to selected memory elements connected to those same lines. The absence of the need for diodes significantly reduces the complexity of the array and thus the number of processing steps required to manufacture it. The terms connected and coupled refers to direct and indirect connections/couplings.

Indeed, the manufacture of the three-dimensional array of memory elements herein is much simpler than other three-dimensional arrays using the same type of memory elements. In particular, a fewer number of masks is required to form the elements of each plane of the array. The total number of processing steps needed to form integrated circuits with the three-dimensional array are thus reduced, as is the cost of the resulting integrated circuit.

Referring initially to FIG. 1A, an architecture of one example of a three-dimensional memory 10 is schematically and generally illustrated in the form of a three-dimensional equivalent circuit of a portion of such a memory. A standard three-dimensional rectangular coordinate system 11 is used for reference, the directions of each of vectors x, y and z being orthogonal with the other two. In another embodiment directions x and y (e.g., of the word lines and serial strings of memory cells are substantially 60 degrees from each other.

A circuit for selectively connecting internal memory elements with external data circuits is preferably formed using select devices Qxy disposed in a selectors layer 14, where x gives a relative position of the device in the x-direction and y gives its relative position in the y-direction. The individual select devices Qxy may be a select gate or a select transistor, as examples. Global bit lines (GBLx) are also provided in the selectors layer 14 and are elongated in the y-direction and have relative positions distributed in the x-direction where the latter is indicated by the subscript. The global bit lines (GBLx) are individually connectable with the input terminal (e.g., source or drain) of the select devices Qxy having the same position in the x-direction, although during reading and also typically during programming only one select device connected with a specific global bit line is turned on at time. The output terminal (the other of the source or drain) of the individual select device Qxy is connected with one of the local bit lines (LBLxy). The local bit lines are elongated vertically, in the z-direction, and form a regular two-dimensional array in the x (row) and y (column) directions.

In order to connect one set or group (in this example, designated as one row) of local bit lines with a corresponding global bit line, row select lines SGy are elongated in the x-direction and connect with control terminals (gates) of a corresponding group (e.g., a single row) of select devices Qxy (where those of a row may have a common position in the y-direction). The select devices Qxy in one embodiment, therefore connect one row of local bit lines (LBLxy) across the x-direction (having the same position in the y-direction) at a time to corresponding ones of the global bit-lines (GBLx), depending upon which of the row select lines SGy receives a voltage that turns on the select devices to which it is connected. The remaining row select lines receive voltages that keep their connected select devices Qxy off. It may be noted that since only one select device (Qxy) is used with each of the local bit lines (LBLxy), the pitch of the array across the semiconductor substrate in both x and y-directions may be made very small, particularly if the select devices Qxy are vertically oriented ones, and thus the density of the memory storage elements can be made relatively large.

Memory elements Mzxy are formed in a plurality of planes (also referred to here as layers) positioned at different distances in the z-direction above the substrate 13. Two planes z=1 and z=2 are illustrated in FIG. 1A but there will typically be more, such as 4, 6, 8, 16, 32, or even more such layers or planes. In each plane at distance z, word lines WLzy are elongated in the x-direction and spaced apart in the y-direction between the local bit-lines (LBLxy). The word lines WLzy of each plane individually cross between adjacent ones of the local bit-lines LBLxy such that there are two bit lines disposed respectively to the left and right of a given connection point or area of each word line. The individual memory storage elements Mzxy are connected between one local bit line LBLxy and one word line WLzy adjacent these individual crossings. An individual memory element Mzxy is therefore addressable by placing proper voltages on the local bit line LBLxy and word line WLzy between which the memory element is connected. The voltages are chosen to provide the electrical stimulus necessary to cause the state of the memory element to change from an existing state to the desired new state. The levels, duration and other characteristics of these voltages depend upon the material(s) used for the memory elements.

Each "plane" of the three-dimensional memory structure is typically formed of at least two sublayers, one in which the conductive word lines WLzy are positioned and another in which there is included a dielectric material that electrically isolates the planes from each other. Additional sublayers may also be present in each plane, depending for example on the structure of the memory elements Mzxy. The planes are stacked on top of each other above a semiconductive substrate with the local bit lines LBLxy being connected with storage elements Mzxy of each plane through which the local bit lines extend.

The memory arrays described herein, including memory 10, are examples of monolithic three dimensional memory structures. A monolithic three dimensional memory structure is one in which multiple memory levels are formed above (and not in) a single substrate, such as a wafer, with no intervening substrates and active areas of the memory are disposed above the substrate. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory structures or monolithic three dimensional memory arrays.

Figure 1B:
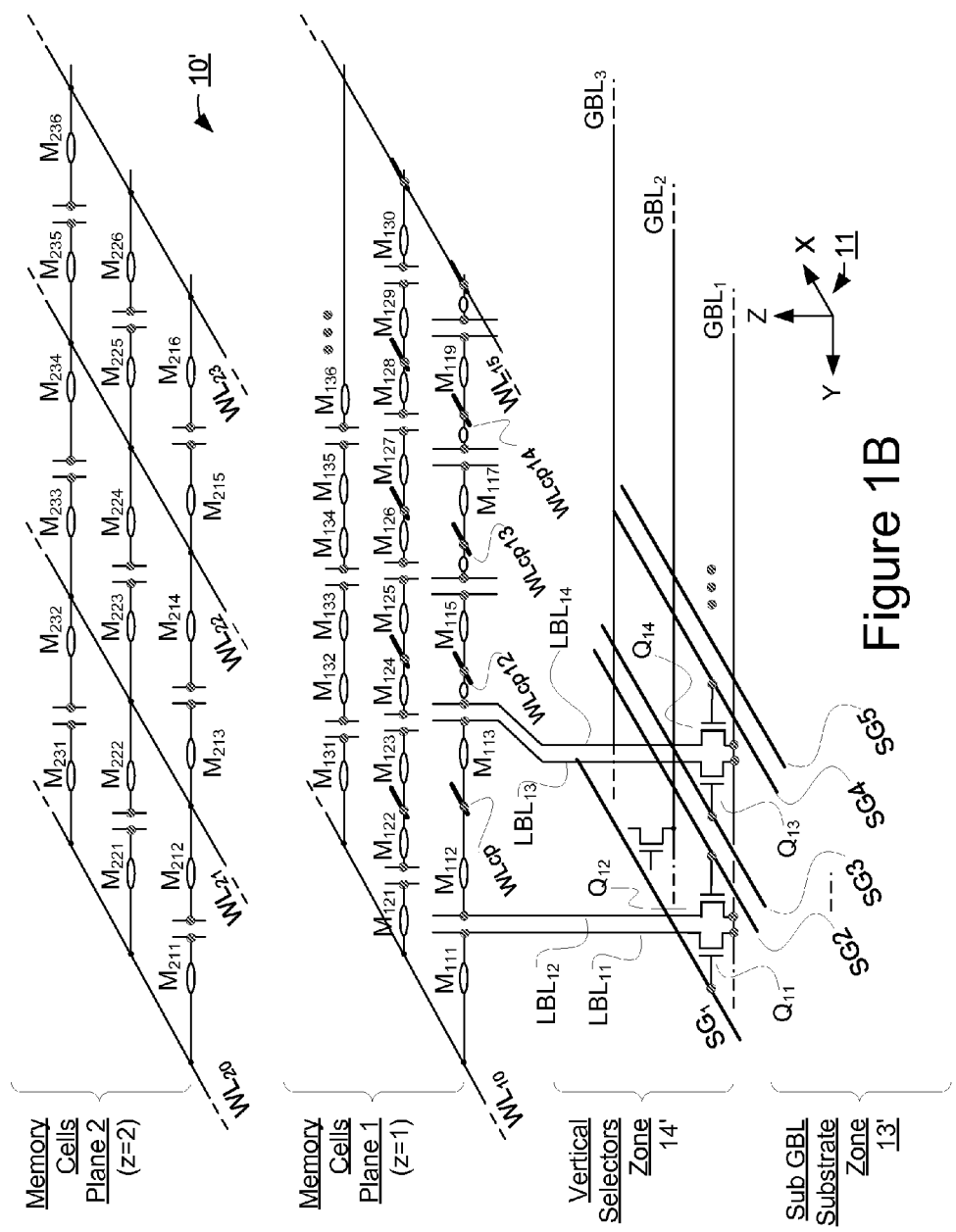
FIG. 1B is an equivalent circuit of a portion of an exemplary second three-dimensional array of variable resistance memory elements, wherein the array has vertically extending, pairs of local bit lines and horizontally extending word lines.

FIG. 1B is an equivalent circuit of a portion of an exemplary second three-dimensional array of variable resistance memory elements, wherein the array has vertically extending, pairs of local bit lines and horizontally extending word lines. In order to avoid illustrative clutter, not all of the components are shown distributed through the three-dimensional structures. However, it is to be understood that many of the basic concepts described for FIG. 1A apply here too. Selector devices Qxy in layer 14' determine which group (e.g., row) of local bit lines (LBL's) while connect to the y-direction extending, global bit lines GBLx. Word lines Wzy extend horizontally through the respective memory cell planes (z=1, 2, ..., N) and between the vertically extending, local bit lines (LBL's). Unlike the case of FIG. 1A however, the local bit lines (LBL's) are provided as pairs and neither memory cells (Mzxy) nor word lines Wzy nor other electrical interconnect elements are disposed between the two local bit lines (e.g., LBL11 and LBL12) of each such pair of immediately adjacent but isolated from one another bit lines (where LBL13 and LBL14 is another example of such a pair). The isolation of the immediately adjacent and isolated-from-one-another local bit lines, (e.g., LBL11 and LBL12) may come in the form of a continuous insulative layer interposed between those local bit lines, (e.g., LBL11 and LBL12) or in the form of an air gap between those local bit lines or as a combination of air pockets and interposed insulative material in areas of the continuous isolation layer not having air pockets.

Each memory cell of the embodiment of FIG. 1A still has first and second operation terminals that respectively connect to a connection point (WLcp) on a nearby word line Wzy and to a connection point (not labeled) on a nearby local bit line LBLxy. Unlike the case in FIG. 1A though, the y-direction extending, serial strings of memory cells are not continuously connected one to the next. For every two memory cells (e.g., M112 and M113) connected to a respective word line connection point (WLcp) there is a leakage current blocking gap formed at the left end by a first pair of isolated-from-one-another local bit lines (e.g., LBL11 and LBL12) and another leakage current blocking gap formed at the right end by a second pair of isolated-from-one-another local bit lines (e.g., LBL13 and LBL14). Accordingly, when respective first and second cell-programming voltage levels (e.g., 0V and VPGM) are applied respectively to a selected word line (e.g., WL11—not shown, see instead WL21) and a selected local bit line (e.g., LBL12), those applied voltages do not propagate through long serial strings of continuously connected, one to the next, memory cells. Instead, the leakage current blocking gaps formed by the pairs of isolated-from-one-another local bit lines (e.g., LBL13 and LBL14) prevent unchecked voltage propagations and thus limit the areas in which undesired leakage currents might flow. As a consequence, measures taken to inhibit undesired leakage currents can be restricted to smaller areas and power consumption may be reduced. This aspect will be better understood when a specific example is given below.

Still referring to FIG. 1B, in one embodiment, not only are the local bit lines (LBL's) provided as pairs of immediately adjacent, but isolated-from-one-another local bit lines (e.g., LBL13 and LBL14), the corresponding bit line selector devices Qxy in layer 14' are provided as pairs of immediately adjacent, and at least partially isolated-from-one-another selector devices. More specifically, the output terminals (e.g., transistor drains) of adjacent bit line selector devices such as Q13 and Q14 are isolated from one another while the input terminals (e.g., transistor sources) of the pair may be joined such that, as each bit line selector device (e.g., Q13 and Q14) is alone turned on, it enjoys a relatively wide source region (input terminal region) and thus a reduced source-to-drain resistance (RdsON). Moreover, the optionally integrally joined together input terminals (e.g., transistor sources) of the pair of adjacent bit line selector devices (e.g., Q13 and Q14) may have a wider contact area with the corresponding global bit line (e.g., GBL1) and thus better contact reliability as well as reduced contact resistance.

In view of the above description of FIG. 1B, a method of fabricating a three-dimensional memory array may comprise: forming a plurality of global bit lines (GBL's) extending in a first direction; forming along and in respective contact with each one of the GBL's a respective plurality of pairs of immediately adjacent, and at least partially isolated-from-one-another selector devices where each pair has an integrated contact coupling input terminals of the pair to the respective GBL and optionally where the input terminals of the pair of selector devices are joined and defined by a unitary structure; for each pair of immediately adjacent, and at least partially isolated-from-one-another selector devices, forming a corresponding pair of immediately adjacent and isolated-from-one-another local bit lines (LBL's); forming a three-dimensional structure having memory cells distributed therein in a matrix format with the pairs of LBL's extending vertically into the matrix of memory cells and with the pairs of LBL's each being interposed between and thus defining a current conduction gap between respective first serial strings of plural memory cells connected to one of the bit lines in the pair and respective second serial strings of plural memory cells connected to the other of the bit lines in the pair; and forming a plurality of word lines (WL's) extending horizontally into the matrix and making contacts with operative terminals of corresponding ones of the memory cells opposite to the terminals connected to by the bit lines (LBL's). A method of operating such a three-dimensional memory array may comprise: applying respective first and second voltages to respective first and second bit lines of corresponding pairs of immediately adjacent and isolated-from-one-another local bit lines (LBL's) that extend in one direction into the three-dimensional memory array; applying respective other voltages to respective word lines that extend in a different second direction into the three-dimensional memory array so as to thereby address a subset of the memory cells for performing at least one of programming and reading the addressed subset of the memory cells. Wherein the applied other voltages of the word lines are prevented from propagating endlessly along serial strings of the memory cells by interposed ones of the pairs of immediately adjacent and isolated-from-one-another local bit lines (LBL's).

Figure 2:
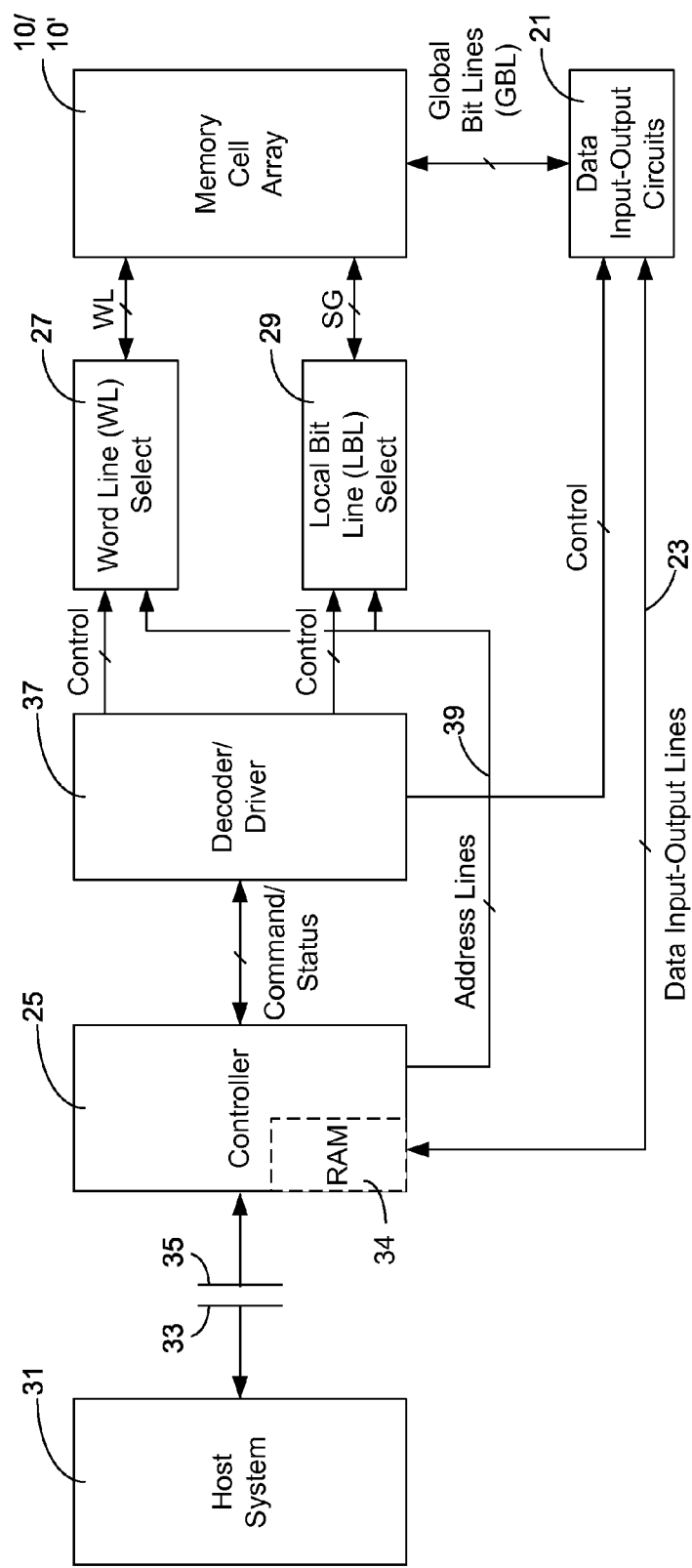
FIG. 2 is a schematic block diagram of a re-programmable non-volatile memory system which can utilizes the memory array of FIG. 1A or FIG. 1B, and which indicates connection of the memory system with a host system.

Referring next to FIG. 2, shown is a block diagram of illustrative memory systems that can respectively use the three-dimensionally organized memories 10 and 10' of FIGS. 1A and 1B respectively. Data input-output circuits 21 are connected to the memory array 10/10' so as to provide (during programming) and receive (during reading) analog electrical quantities in parallel over the global bit-lines GBLx of FIGS. 1A/1B that are representative of data stored in addressed memory elements Mzxy. Data input-output circuits 21 typically contain sense amplifiers for converting sensed ones of these electrical quantities (e.g., voltages, currents) into digital data values during reading, which digital values are then conveyed over lines 23 to a memory system controller 25. Conversely, data to be programmed into the array 10 are sent by the controller 25 to the input-output circuits 21, which then program that data into addressed memory elements by placing proper programming voltages (e.g., VPGM) on the global bit lines GBLx. For binary operation, one voltage level is typically placed on a global bit line to represent a binary "1" and another voltage level to represent a binary "0". The memory elements are addressed for reading or programming by further voltages placed on the word lines WLzy and on the row select lines SGy by respective word line select circuits 27 and local bit line selecting circuits 29. In the specific three-dimensional arrays of FIGS. 1A/1B, the memory elements lying between a selected word line and any of the local bit lines LBLxy connected at one instance through the select devices Qxy to the global bit lines GBLx may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. The latter may include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts may require the use of adapters into which a memory card is plugged, and others may require the use of cables there between. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a sequential state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10/10' in order to carry out a command from the host. The physical addresses correspond to logical addresses received from the host system 31, the conversion being made by the controller 25 and/or the decoder/driver 37. As a result, the local bit line selecting circuits 29 partially address the designated storage elements within the array 10/10' by placing proper voltages on the control elements of the selector devices Qxy to connect selected local bit lines (LBLxy) with the global bit lines (GBLx). The addressing is completed by the circuits 27 applying proper voltages to the word lines WLzy of the array. In one embodiment, any one or combination of Controller 25, decoder/driver circuits 37, circuits 21, 27 and 29, or other control logic can be referred to as one or more control circuits.

Although the memory system of FIG. 2 utilizes the three-dimensional memory arrays 10/10' respectively depicted in FIGS. 1A and 1B, the system is not limited to use of only those array architectures. A given memory system may alternatively combine this type of memory with other another type including flash memory, such as flash memory having a NAND memory cell array architecture, a magnetic disk drive or some other type of memory. The other type of memory may have its own controller or may in some cases share the controller 25 with the three-dimensional memory cell array 10/10', particularly if there is some compatibility between the two types of memory at an operational level.

Although each of the memory elements Mzxy in the respective arrays 10/10' of FIGS. 1A/1B may be individually addressed for changing its state according to incoming data or for reading its existing storage state, it may be preferable to program and read the array in units of multiple memory elements in parallel. In the three-dimensional arrays of FIGS. 1A/1B, one row of memory elements on one plane may be programmed and read in parallel. The number of memory elements operated in parallel depends on the number of memory elements connected to the selected word line. In some arrays, the word lines may be segmented (not shown in FIG. 1A) so that only a portion of the total number of memory elements connected along their segment length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed ones of the array memory elements whose data have become obsolete may be addressed and re-programmed to new states different from those which they were previously programmed to have. The states of the memory elements being re-programmed in parallel will therefore most often have different starting states among them. This is acceptable for many memory element materials but it is usually preferred to re-set a group of memory elements to a common reference state before they are re-programmed. For this purpose, the memory elements may be grouped into blocks, where the memory elements of each block are simultaneously reset to a common reference state, preferably one of the distinct programmed states (e.g., a "1" or a "0"), in preparation for subsequently programming them. If the memory element material being used is characterized by changing from a first to a second state in significantly less time than it takes to be changed from the second state back to the first state, then the reset operation is preferably chosen to cause the transition taking the longer time to be made. The subsequent programming can then be performed faster than the resetting to the common reference state. The longer reset time is usually not a problem since resetting blocks of memory elements containing nothing but obsolete data is typically accomplished for a high percentage of cases in the background, therefore not adversely impacting the foreground programming performance of the memory system.

With the use of block re-setting of memory elements, a three-dimensional array of variable resistive memory elements may be operated in a manner similar to flash memory arrays. Resetting a block of memory elements to a common reference state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

An example of use of such blocks and pages is first illustrated with reference to FIG. 3A, which provides plan schematic views of planes z=1 and z=2 of the array 10 of FIG. 1A. The different word lines WLzy that extend across each of the planes and the local bit lines LBLxy that extend up through the planes are shown within corresponding two-dimensional cross sections. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements M114, M124, M134, M115, M125 and M135 (symbolized by circles) connected to both sides of one word line WL12 form the corresponding block of the exemplary WL12. Of course, there will generally be many more memory elements than shown connected along the length of a word line. Only a few are illustrated for simplicity. The memory elements of each block are connected between the single word line and different ones of the local bit lines (LBL's) on both sides, namely, for the block illustrated in FIG. 3A, between the word line WL12 and respective local bit lines LBL12, LBL22, LBL32, LBL13, LBL23 and LBL33.

Figure 3A:
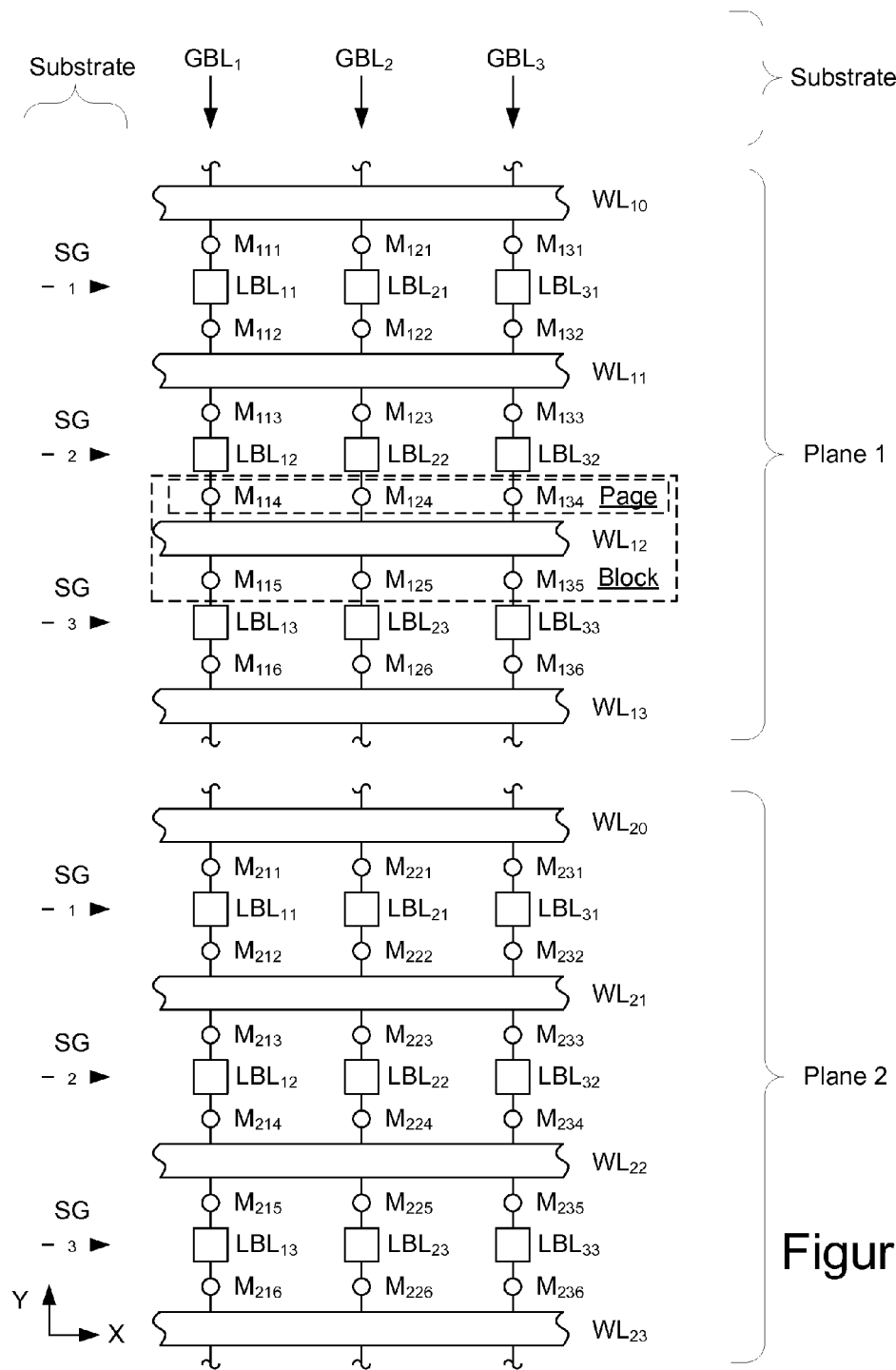
FIG. 3A provides plan views of the two planes and substrate of the three-dimensional array of FIG. 1A, with some additional structure added.

A set of memory cells designated as a page is also illustrated in FIG. 3A. In the specific embodiment being described, there are two pages per block. One page is formed by the memory elements along one side of the word line (WL) of the block and the other page by the memory elements along the opposite side of the word line. The example page marked in FIG. 3A is formed by memory elements M114, M124 and M134. Of course, a page will typically have a very large number of memory elements in order to be able to program and read a large amount of data at one time. Only a few of the storage elements of the page of FIG. 3A are included, for simplicity in explanation.

Example resetting, programming and reading operations of the memory array of FIGS. 1A and 3A, when operated as array 10 in the memory system of FIG. 2, will now be described. For these examples, each of the memory elements Mzxy is taken to include a non-volatile memory material that can be switched between two stable states of different resistance levels by impressing voltages (or currents) of different polarity across the memory element, or voltages of the same polarity but different magnitudes and/or durations. For example, one class of material may be placed into a high resistance state by passing current in one direction through the element, and into a low resistance state by passing current in the other direction through the element. Or, in the case of switching using the same voltage polarity, one element may need a higher voltage and a shorter application time to switch to a high resistance state and a lower voltage and a longer time to switch to its lower resistance state. These discrete states may constitute the binary memory states of the individual memory elements that indicate storage of one bit of data, which is either a "0" or a "1," depending upon the memory element state.

In one embodiment, to reset (e.g., erase) a block of memory elements, the memory elements in that block are placed into their high resistance states. This state will be designated as the logical data state "1," following the convention used in current flash memory arrays but it could alternatively be designated to be a "0." As shown by the example in FIG. 3A, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows disposed on the sides of the word line.

The following steps may be taken to reset all the memory elements of a block, using the block illustrated in FIG. 3A as an example:

1. Set all of the global bit lines ($GBL_1$, $GBL_2$ and $GBL_3$ in the array of FIGS. 1A and 3A) to zero volts (0V), by the circuits 21 of FIG. 2.
2. Set at least the two row select lines (SG's) on either side of the one word line of the block to H' volts (high), so that the local bit lines on each side of the word line in the y-direction are connected to their respective global bit lines through their select devices and therefore brought to zero volts. The voltage H' is made high enough to turn on the select devices $Q_{xy}$, for example, something in a range of 1-6 volts, typically 3 volts. The exemplary block shown in FIG. 3A includes the word line WL12, so the row select lines $SG_2$ and $SG_3$ (FIG. 1A) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3 and to propagate the applied 0V levels. Two of the local bit lines adjacent to each other in the y-direction are connected to a respective single global bit line (e.g., $GBL_1$). Those local bit lines along $GBL_1$ (as an example) are then set to the zero volts while the remaining local bit lines along $GBL_1$ (as an example) preferably remain unconnected to that respective global bit line (e.g., $GBL_1$) and with their voltages thus floating.
3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1A and 3A, word line $WL_{12}$ is placed at H volts, while all other word lines in the array are placed at zero volts, all by the circuits 27 of FIG. 2.

The result is that H volts are placed across each of the memory elements of the block. In the example block of FIG. 3A, this includes the memory elements M114, M124, M134, M115, M125 and M135. For the type of memory material being used as an example, the resulting currents through these memory elements places any of them not already in a high resistance state, into that re-set state.

It may be noted that no stray currents will flow during such a block reset because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any of the other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3A is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements need to be switched into their low resistance state (their set state), while the remaining memory elements of the page remain in the previously attained reset state.

For programming a page, only one row of select devices (e.g., those of SG2) is turned on, resulting in only one row of local bit lines being connected to their respective global bit lines. This connection alternatively allows the memory elements of both pages of the block to be programmed in two sequential programming cycles, which then makes the number of memory elements in the reset and programming units equal.

Figure 4:
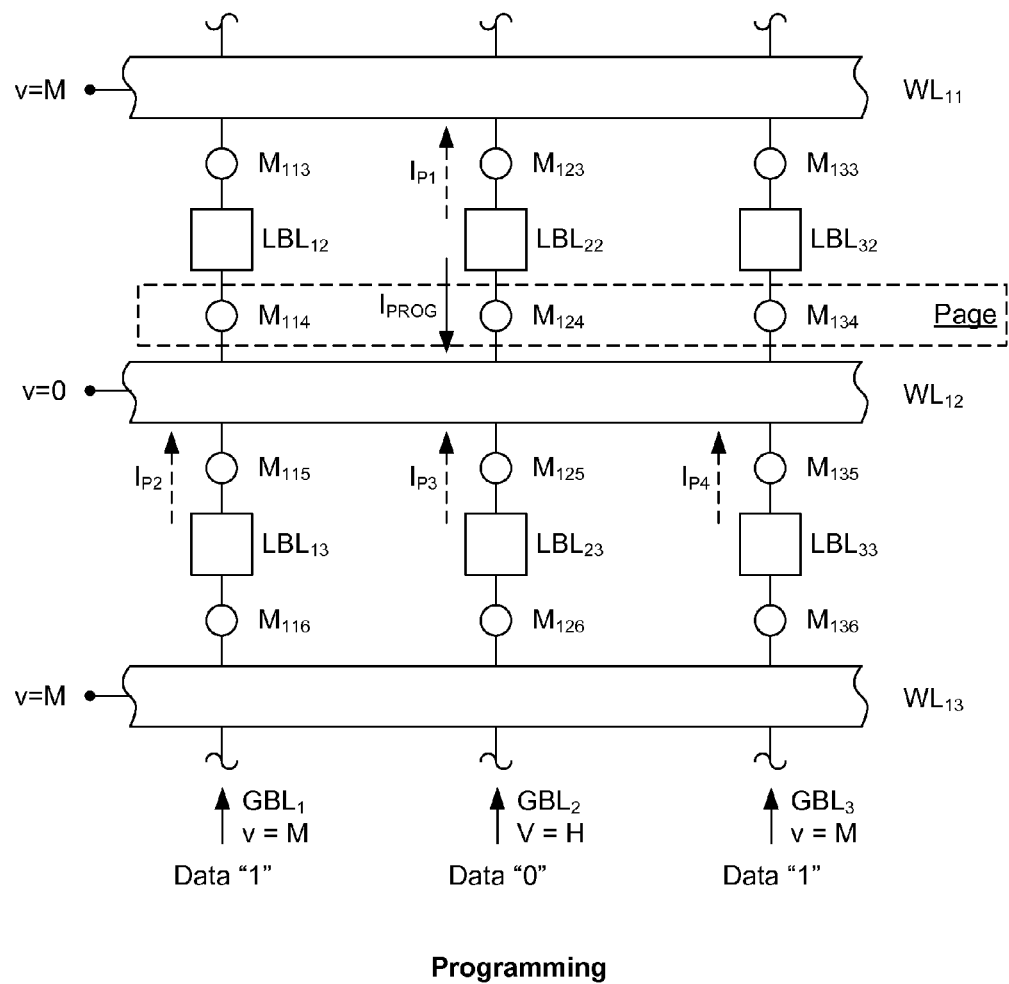
FIG. 4 is an expanded view of a portion of one of the planes of FIG. 3A, annotated to show possible parasitic effects when programming data therein.

Referring to FIGS. 3A and 4, an example programming operation within the indicated one page of memory elements M114, M124 and M134 is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." Gate line $SG_2$ is activated so that the bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.
2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.
3. As indicated above, after the desired levels on the GBL's settle, the process sets one of the row select lines below and on either side of the selected word line to the H' voltage level, in order to select a page for programming.

For the page indicated in FIGS. 3A and 4, the H' voltage is placed on row select line $SG_2$ in order to turn on select devices $Q_{12}$, $Q_{22}$ and $Q_{32}$ (FIG. 1). All other row select lines, namely lines $SG_1$ and $SG_3$ in this example, are set to 0 volts in order to keep their bit line selector devices turned off. The row select line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current IPROG is sent through the memory element M124, thereby causing that memory element to change from a reset state to a set (programmed) state. The same will occur with other memory elements (not shown) that are connected between the selected word line WL12 and a local bit line (LBL) that has the programming voltage level H applied. (The possible flows of undesired parasitic currents as opposed to desired programming currents IPROG will be discussed shortly.)

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line WL12 and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but LBL12, LBL22 and LBL32), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

Because series and parallel networks of resistive elements (memory cells) and conductors are present in the embodiment of FIG. 3A, there are typically parasitic currents present during the programming operation that can increase the currents that must be supplied through the selected word line and global bit lines. During programming there are at least two sources of parasitic currents, one to the adjacent page in a different block and another to the adjacent page in the same block. An example of the first is the parasitic current IP1 shown on FIG. 4 from the local bit line LBL22 that has been raised to the voltage level H during programming. The memory element M123 is connected between that voltage and the voltage level M on its word line WL11. This voltage difference can cause the parasitic current –IP1 to flow. Since there is no such voltage difference between the local bit lines LBL12 or LBL32 and the word line WL11, no such parasitic current flows through either of the memory elements M113 or M133, a result of these memory elements remaining in the reset state according to the data being programmed.

Other parasitic currents can similarly flow from the same local bit line LBL22 to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other mentioned source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents IP2, IP3 and IP4 shown in FIG. 4. In general, these currents will be much less than the other parasitic current IP1 discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 3B:
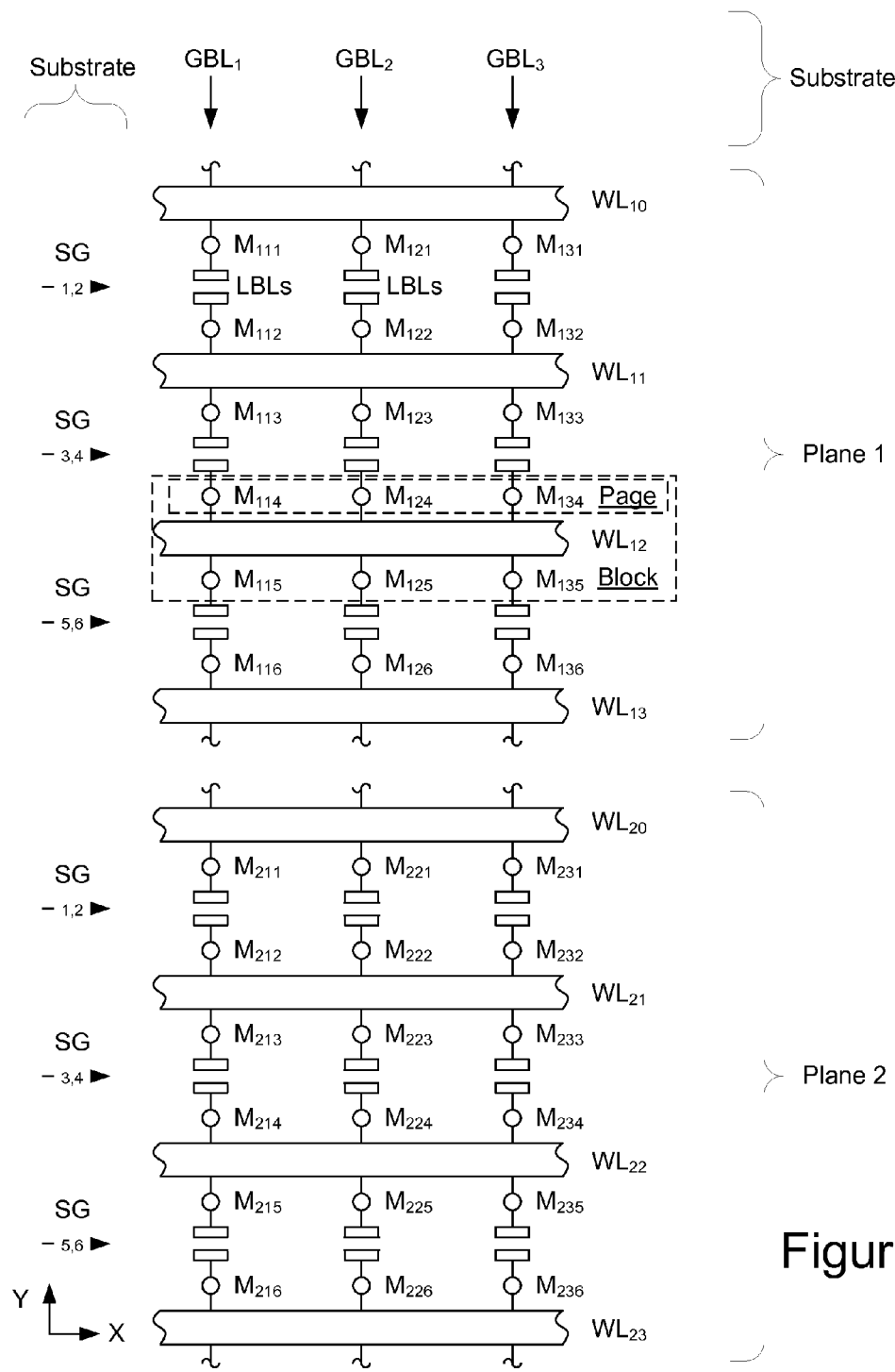
FIG. 3B provides plan views of the two planes and substrate of the three-dimensional array of FIG. 1B, with some additional structure added.

Referring to the configuration of FIG. 3B, where the latter corresponds with that of FIG. 1B, here pairs of immediately adjacent and isolated-from-one-another local bit lines (LBL's) bound each block. As a result, the extents of parallel/series resistive networks are reduced. Parasitic currents such as Ip1 of FIG. 4 cannot flow because the exemplary LBL22 of FIG. 4 is replaced in FIG. 3B by a pair of immediately adjacent and isolated-from-one-another local bit lines (LBL's).

The resistive network bounding effect of using immediately adjacent and isolated-from-one-another local bit lines (LBL's) is not just present within a single plane (e.g., Plane z=1 of FIG. 3B) but rather extends vertically up the planes because the same adjacent and isolated-from-one-another local bit lines (LBL's) shown in Plane z=1 of FIG. 3B reappear in Plane z=2 and yet higher planes (not shown). In one embodiment, two independently driven, row select lines such SG1 and SG2 shown in FIG. 3B are used for the corresponding two bit lines of each row of pair of immediately adjacent and isolated-from-one-another local bit lines (LBL's). In one embodiment, the two independently driven, row select lines such SG1 and SG2 shown in FIG. 3B are respectively driven from one of opposed sides of the substrate so that contacts to the adjacent row select lines (such SG1 and SG2) shown in FIG. 3B are not crowded together. More specifically, the driving circuit contact for SG1 may be on the left side of FIG. 3B while the driving circuit contact for SG2 may be on the right side.

Figure 5:
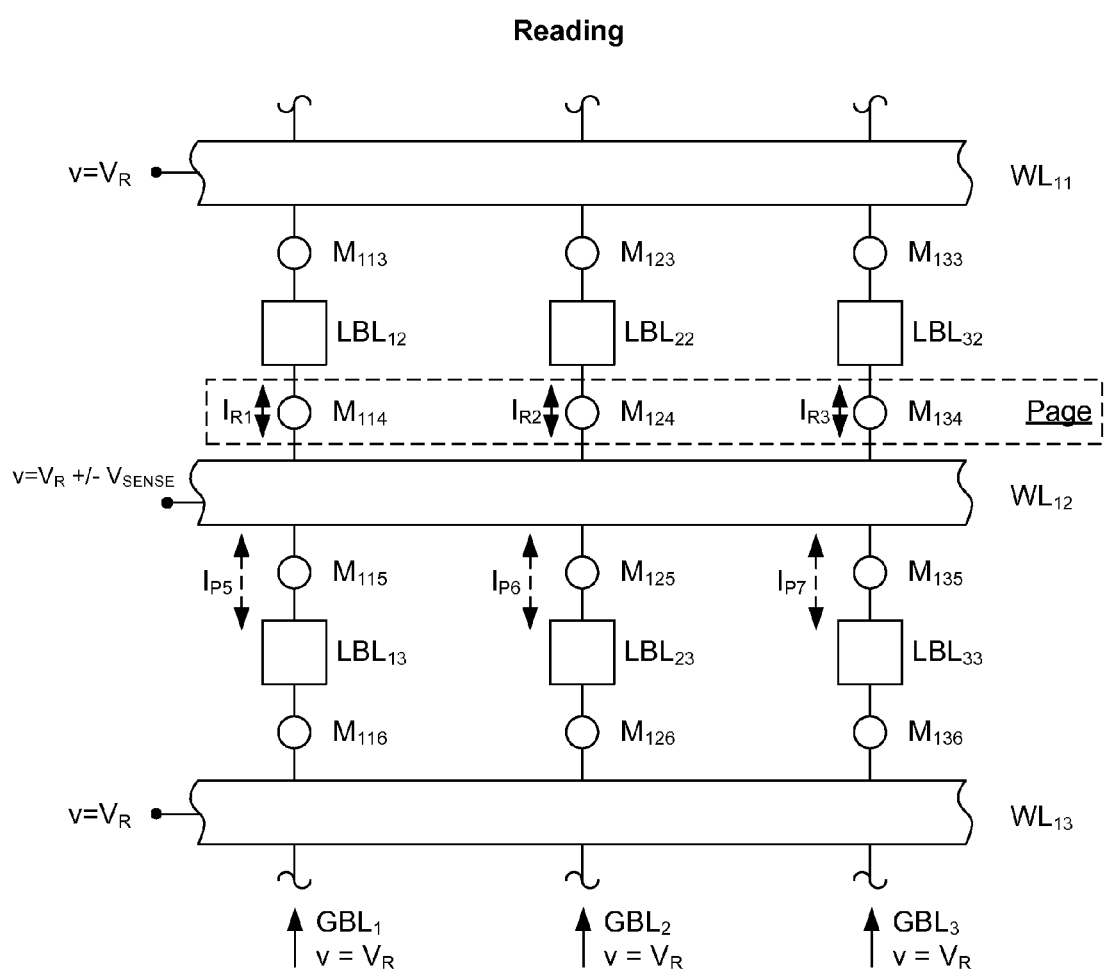
FIG. 5 is an expanded view of a portion of one of the planes of FIG. 3A, annotated to show possible parasitic effects when reading data therefrom.

Referring next and primarily to FIG. 5, the parallel reading of the states of a page of memory elements, such as the memory elements M114, M124 and M134 of FIG. 3A is described. The steps of an example reading process are as follows:

1. Set all the global bit lines GBLs and all the word lines WL to a predetermined reference voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of bit line selector devices by placing a voltage on the control line adjacent to the selected word line (e.g., $SG_2$) in order to define the page to be read. In the example of FIGS. 1A, 3A and 5, a voltage is applied to the row select line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.

3. Set the selected word line ($WL_{12}$) to a voltage of $V_R \pm V\text{sense}$. The sign of Vsense is chosen based on the sense amplifier and in one embodiment, has a magnitude of about 0.5 volt. The voltages on all other word lines remain at $V_R$.

4. Sense the current flowing into ($V_R+V\text{sense}$) or out of ($V_R-V\text{sense}$) each sense amplifier for a predetermined time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. Integration over time may be used by the sense amplifiers. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.

5. Turn off the selector devices ($Q_{12}$, $Q_{22}$ and $Q_{32}$) by removing the voltage from the row select line ($SG_2$), in order to disconnect the local bit lines from the global bit lines, and return the selected word line ($WL_{12}$) to the voltage $V_R$.

In the case of reading using the configuration of FIG. 5 (and of FIGS. 1A and 3A) parasitic currents may flow during such read operations and may present two undesirable effects. As with programming, parasitic currents place increased demands on the memory system power supply. In addition, it is possible for parasitic currents to exist that are erroneously included in the currents passed through the addressed memory elements that are being read. This can therefore lead to erroneous read results if such parasitic currents are large enough.

As in the programming case, all of the local bit lines except the selected row (LBL12, LBL22 and LBL32 in the example of FIG. 5) are floating. But the potential of the floating local bit lines may be driven to VR by any memory element that is in its programmed (low resistance) state and connected between a floating local bit line and a word line at VR, in any plane. A parasitic current comparable to IP1 in the programming case (FIG. 4) is not present during data read because both the selected local bit lines and the adjacent non-selected word lines are both at VR. Parasitic currents may flow, however, through low resistance memory elements connected between floating local bit lines and the selected word line. These are comparable to the currents IP2, IP3, and IP4 during programming (FIG. 4), indicated as IP5, IP6 and IP7 in FIG. 5. Each of these currents can be equal in magnitude to the maximum read current through an addressed memory element. However, these parasitic currents are flowing from the word lines at the voltage VR to the selected word line at a voltage VR±Vsense without flowing through the sense amplifiers. These parasitic currents will not flow through the selected local bit lines (LBL12, LBL22 and LBL32 in FIG. 5) to which the sense amplifiers are connected. Although they contribute to power dissipation, these parasitic currents generally do not therefore introduce a sensing error.

Although the neighboring word lines should be at VR to minimize parasitic currents, as in the programming case it may be desirable to weakly drive these word lines or even allow them to float. In one variation, the selected word line and the neighboring word lines can be pre-charged to VR and then allowed to float. When the sense amplifier is energized, it may charge them to VR so that the potential on these lines is accurately set by the reference voltage from the sense amplifier (as opposed to the reference voltage from the word line driver). This can occur before the selected word line is changed to VR±Vsense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for local bit lines and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional arrays disclosed herein, the total magnitude of parasitic currents can be managed without the inclusion of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current vs voltage relationship are also envisioned. For example as the voltage across a HfO based memory element (Hafnium Oxide) is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as WL12 in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory arrays described herein respectively have a number of advantages. The quantity of digital data that may be stored per unit of semiconductive substrate area is high. It may be manufactured with a lower cost per stored bit of data. Only a few masks may be required for patterning the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current flow path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2N cells associated or "touched" with every data operation. In the vertical local bit lines architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

The material(s) used for forming the non-volatile memory elements Mzxy in the respective arrays 10/10' of FIGS. 1A/1B can be a chalcogenide, a metal oxide (MeOx), CMO, or any one of a number of materials that exhibit a stable, reversible shift in resistance in response to an external voltage applied to or current passed through the material.

Metal oxides (MeOx) are characterized by being insulating when initially deposited. One suitable metal oxide is a titanium oxide (TiOx) in which near-stoichiometric TiO2 bulk material is altered in an annealing process to create an oxygen deficient layer (or a layer with oxygen vacancies) in proximity of the bottom electrode. The top platinum electrode for memory storage element comprising TiOx, with its high work function, creates a high potential Pt/TiO2 barrier for electrons. As a result, at moderate voltages (below one volt), a very low current will flow through the structure. The bottom Pt/TiO2-x barrier is lowered by the presence of the oxygen vacancies (O+2) and behaves as a low resistance contact (ohmic contact). (The oxygen vacancies in TiO2 are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier Pt/TiO2 is reduced and a relatively high current can flow through the structure. The device is then in its low resistance (higher conduction) state. Experiments reported by others have shown that conduction is occurring in filament-like regions of the TiO2, perhaps along grain boundaries.

The conductive path is broken by applying a large positive voltage across the structure. Under this positive bias, the oxygen vacancies move away from the proximity of the top Pt/TiO2 barrier, and "break" the postulated conduction filaments. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements Mzxy in the arrays of FIGS. 1A/1B include HfOx, ZrOx, WOx, NiOx, CoOx, CoalOx, MnOx, ZnMn2O4, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, IrO2 and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., HfO2) as a reversible resistance-switching material, and positions the reversible resistance-switching material between two electrodes (memory cell terminals). A first electrode is positioned between reversible resistance-switching material and a first conductor (e.g. bit line or word line). In one embodiment, the first electrode is made of platinum. The second electrode is positioned between reversible resistance-switching material a second conductor (e.g., local bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., local bit lines and/or word lines). In other words, direct contact is made to the active material of the memory cell.

Another class of materials suitable for the memory storage elements is solid electrolytes but since they are electrically conductive when deposited, individual memory elements need to be formed and isolated one from the next. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB_2)_{1-x}$, where A is Ag or Cu, B is S or Se, and M is a transition metal such as Ta, V, or Ti, and x ranges from about 0.1 to about 0.7.

Such a composition minimizes oxidizing unwanted material into the solid electrolyte. One example of such a composition is Agx(TaS2)1-x. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or graphene like-carbon) and insulating (or amorphous carbon). The difference in the two types of carbon material is the content of the carbon chemical bonds, so called sp2 and sp3 hybridizations. In the sp3 configuration, the carbon valence electrons are kept in strong covalent bonds and as a result the sp3 hybridization is non-conductive. Carbon films in which the sp3 configuration dominates, are commonly referred to as tetrahedral-amorphous carbon, or diamond like. In the sp2 configuration, not all the carbon valence electrons are kept in covalent bonds. The weak tight electrons (phi bonds) contribute to the electrical conduction making the mostly sp2 configuration a conductive carbon material. The operation of the carbon resistive switching nonvolatile memories is based on the fact that it is possible to transform the sp3 configuration to the sp2 configuration by applying appropriate current (or voltage) pulses to the carbon structure. For example, when a very short (1-5 ns) high amplitude voltage pulse is applied across the material, the conductance is greatly reduced as the material sp2 changes into an sp3 form ("reset" state). It has been theorized that the high local temperatures generated by this pulse causes disorder in the material and if the pulse is very short, the carbon "quenches" in an amorphous state (sp3 hybridization). On the other hand, when in the reset state, applying a lower voltage for a longer time (~300 nsec) causes part of the material to change into the sp2 form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition GexSbyTez, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) directly form these terminal electrodes by direct contact with the memory material, those lines (WL's, LBL's) preferably include the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a semiconductive p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to its low resistance state, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is binary-wise either reset or set and holds one bit of data. However, the techniques of the present application are not limited to this simple case. By using various discrete values of ON resistances and designing the sense amplifiers to be able to discriminate between several of such values, each memory element can hold multiple-bits of data and thus operates as a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, June 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Figure 6:
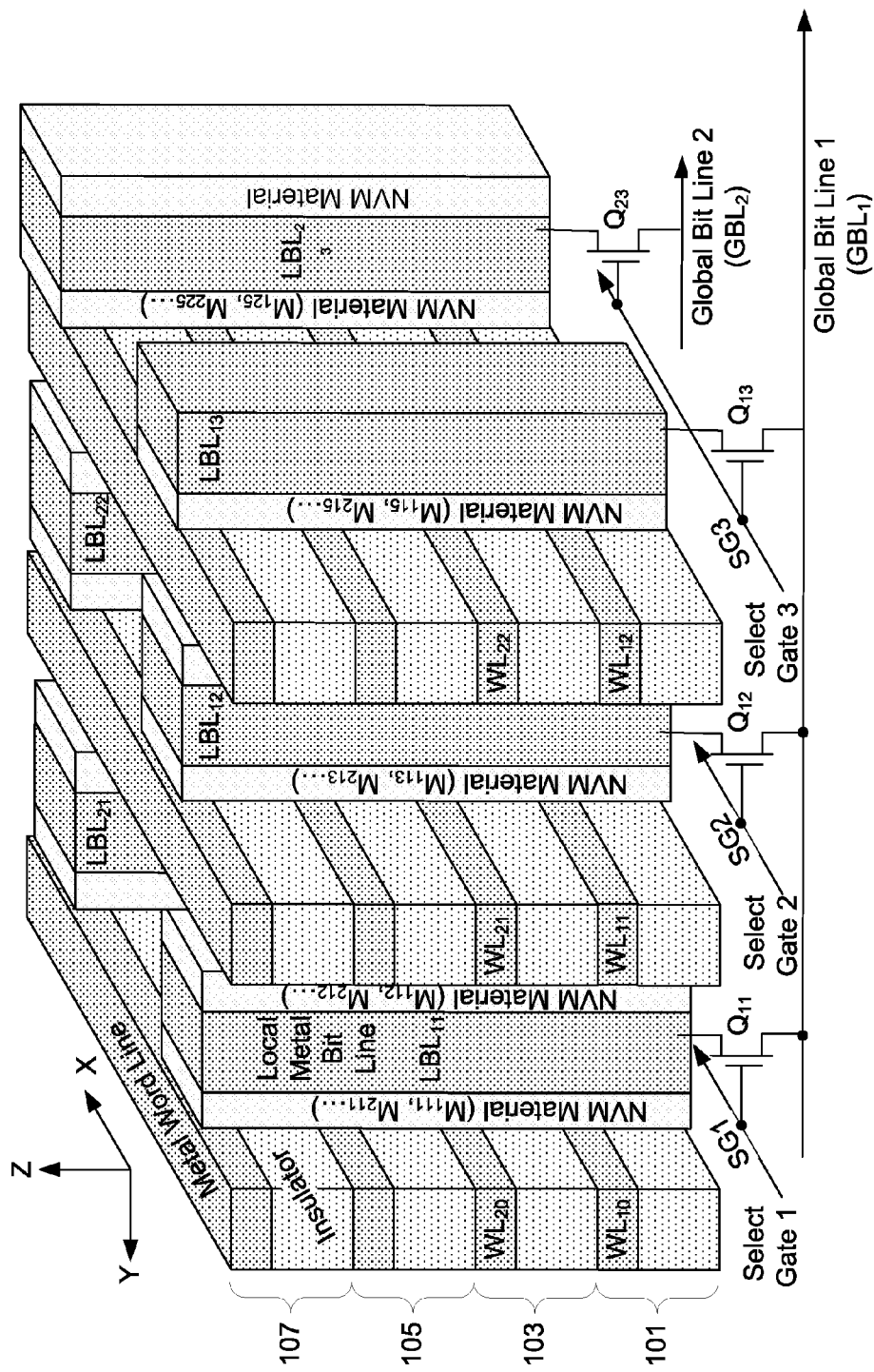
FIG. 6 is an isometric view of a portion of the three-dimensional array shown in FIG. 1A according to a first specific example of an implementation thereof.

One example semiconductor-based structure for implementing the three-dimensional memory element array of FIG. 1A is illustrated in FIG. 6, which is configured for use of non-volatile memory element (NVM) material that is non-conductive when first deposited and thus does not create shorts between vertically stacked word lines (WL's). Metal oxide of a type discussed above (e.g., HfO) tend to have this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sidewalls of the vertical bit lines in the y-direction and extending upwards through all the planes. A significant advantage of the structure of FIG. 6 is that all word lines and strips of insulation under them in a group of planes may be defined simultaneously (patterned) by use of a single mask and appropriate etch down process, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1A are identified by the same reference numbers. It will be noted that FIG. 6 shows the two planes 1 and 2 of FIG. 1A plus two additional planes on top of them. All of the planes have the same horizontal pattern of conductor, dielectric and NVM material. In each plane, metal word lines (WL) are elongated in the x-direction and spaced apart from each other in the y-direction. Each plane (horizontal layer) includes a sublayer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular matrix of such through-the-plane crossing conductors in the x-y directions.

Each bit line pillar is connected to one of a set of global bit lines (GBL's) in the semiconductive (e.g., silicon) substrate running in the y-direction at the same pitch as the pillar spacing through the selector devices (Qxy) formed in or on the substrate whose gates are driven by the row select lines (SG's) elongated in the x-direction, which are also formed in or on the substrate. The selector devices Qxy may be conventional CMOS transistors (or vertical MOSFET thin film transistors, or Junction FET, or npn transistors) and may be fabricated using the same process as used to form other conventional circuitry parts of the apparatus. In the case of using npn transistors instead of MOS transistors, the row select lines (SG) are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one selector device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is caused to be located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the selector devices $Q_{xy}$, global bit lines GBL, row select lines SG and other circuits peripheral to the array of memory cells, is formed in or on the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the selector devices Q are formed. In the example of FIG. 6, four such sheets are formed.
3. These sheets are then patterned (e.g., etched to define isolated portions) by using a mask formed over the top of them that has slits elongated in the x-direction and spaced apart in the y-direction. All of the material is removed down to the etch stop layer (e.g., TiN—not shown) in order to form the trenches shown in FIG. 6 in which the local bit line (LBL) pillars and NVM material is later formed. Contact holes are also etched through the etch stop material layer at the bottom of the trenches to allow access to the drains of the selector devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the sidewalls of the word line (WL) surfaces that are exposed into the trenches.
5. Doped polysilicon (or suitable metallic electrode material) is then deposited in these trenches in order to make contact with the NVM material. The deposited material is patterned using a mask with slits in the y-direction.

Removal of the deposited material by etching through this mask leaves behind the illustrated local bit line (LBL) pillars. The NVM material in the x-direction may also be removed between pillars during the patterning process. The space between pillars in the x-direction is then filled with a dielectric material and the top side dielectric may be planarized back to the top of the preceding structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed (extended in depth) by way of sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

To enable the memory to be denser (e.g., more memory elements per area), the size of the memory elements can be made smaller and the memory elements can be arranged closer to each other than in the past. To enable the memory elements to be closer to each other, one embodiment uses a vertically oriented selector device (e.g., three terminal switch and/or select transistor) for connecting the individual local bit line pillars to the respective global bit lines. For example, the selector devices Q11, Q12, . . . , Q21, Q22, . . . of FIGS. 1A/1B can be implemented as vertically oriented selector devices. In one embodiment, each vertically oriented selector device is a pillar select device that is formed as a vertical structure, providing switched connection and disconnection between a local bit line pillar (LBL) and a corresponding portion of the global bit line (GBL). The pillar select devices, unlike previous embodiments where they are formed within a CMOS layer, are in the present embodiments formed in a separate layer (pillar select layer) above the CMOS layer/substrate, along the z-direction between the array of global bit lines and the array of local bit lines. The CMOS layer is in the substrate where the support circuitry is implemented, including the row select circuit and word line drivers. The use of vertically oriented selector devices above, but not in, the substrate allows the memory elements to be arranged in a more compact fashion, thereby increasing density. Additionally, positioning the vertically oriented selector devices above the substrate allows for other devices (e.g., the word line drivers) to be positioned in the substrate under the memory array rather than laterally outside of the area consumed by the memory cells array, which allows the integrated circuit to be smaller.

For example, a pillar shaped Thin Film Transistor (TFT) FET or JFET can be can be used as the bit line selector device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 7:
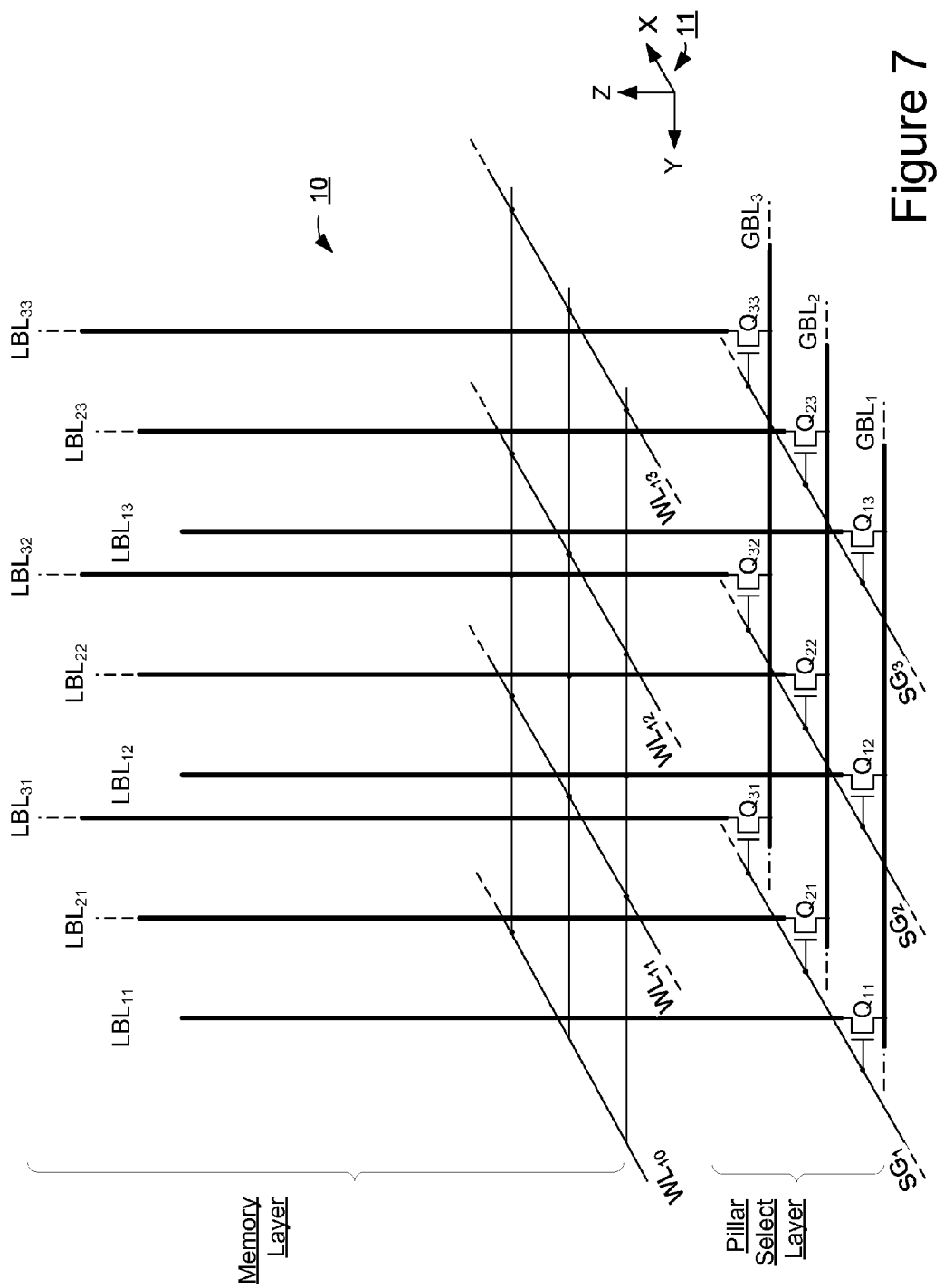
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically and with the clutter of the memory cells left out, the three dimensional memory apparatus ("3D memory") organized as a memory layer (or three-dimensional first structure) disposed on top of a pillar selecting layer (or three-dimensional second structure). The illustrated parts of the 3D memory apparatus (of for example FIG. 1A) is formed on top of a semiconductive substrate having CMOS circuitry monolithically integrated therein (substrate and its internal circuitry not explicitly shown) where structures in the CMOS substrate are referred to here as being in the FEOL ("Front End of Lines"). The vertically oriented selector devices provide selective coupling between respective individual ones of the vertical bit lines (that are above and not in the substrate) to individual global bit lines (GBL's) are now formed on top of the FEOL layer in the BEOL ("Back End of Lines") section. Thus, the BEOL comprises the pillar select layer with the 3D memory layer disposed on top of it. The vertically oriented selector devices (such as Q11, Q12, . . . , Q21, Q22, . . . , etc.) are formed in the pillar select layer as vertically oriented select devices. The pillar select layer is formed above (and not in) the substrate. The memory layer is similar to that described above, comprising of multiple layers of word lines and memory elements. For simplicity, FIG. 7 shows only one layer of word lines, such as WL10, WL11, . . . , etc. without showing the memory elements that exist between each crossing of a word line and a bit line.

Figure 8B:
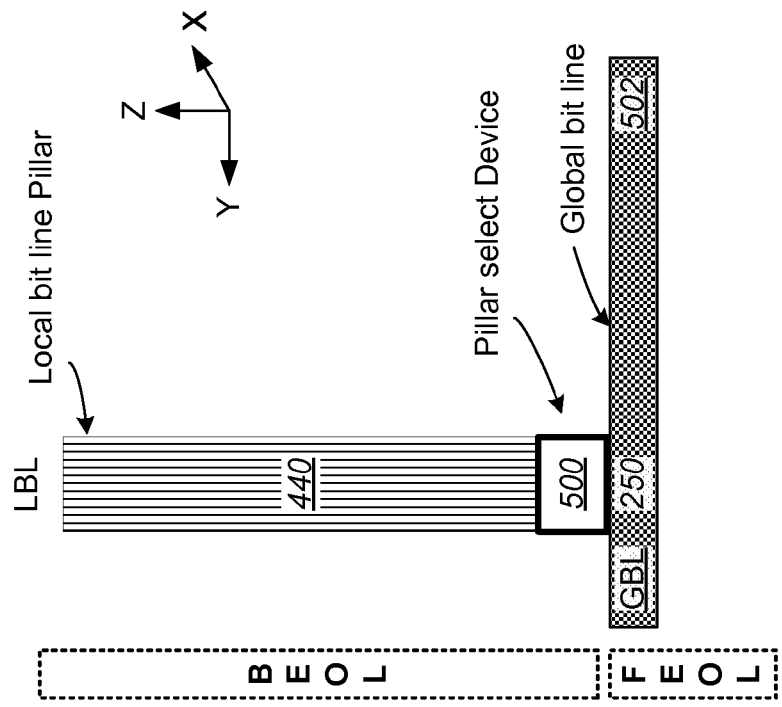
FIG. 8B is a plan view that depicts a vertical bit line, a vertically oriented select device and a global bit line.
Figure 8A:
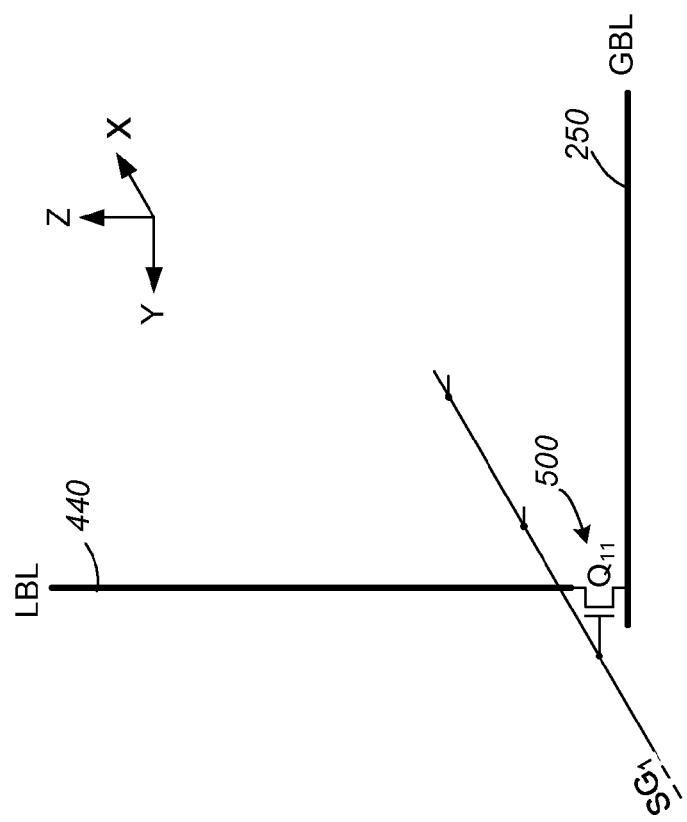
FIG. 8A is a schematic that depicts a vertical bit line, a vertically oriented select device and a global bit line.

FIG. 8A illustrates a schematic circuit diagram of a given vertically oriented select device switching a local bit line to a global bit line. In the example, the local bit line LBL 440 is switchable to the global bit line GBL 250 by a vertically oriented select transistor 500 such as Q11. The gate of the select transistor Q11 is controllable by a signal exerted on a row select line SG1.

FIG. 8B illustrates the structure of the vertically oriented select device in relation to the local bit line and the global bit line. The global bit line such as GBL 250 is formed below the vertically oriented select device, in the FEOL for example as part of a metal layer-1 or metal layer-2 provided within the FEOL and denoted in FIG. 8B as 502. The vertically oriented select device in the form of the vertical active TFT transistor 500 (e.g., vertically oriented channel MOS TFT or vertically oriented channel JFET) is formed in the BEOL layer on top of the GBL 250 (and above, but not in, the substrate). The local bit line LBL 440, in the form of a pillar, is formed on top of the vertically oriented select device 500. In this way, the vertically oriented select device 500 can switch the local bit line pillar LBL to connect with a corresponding portion of the global bit line GBL 250. In one embodiment, an ohmic contact area is provided for connecting semiconductor portions of a respective one or more bit line pillar selectors (in 500) to a metal conductor provided as part of the GBL 250.

Figure 9:
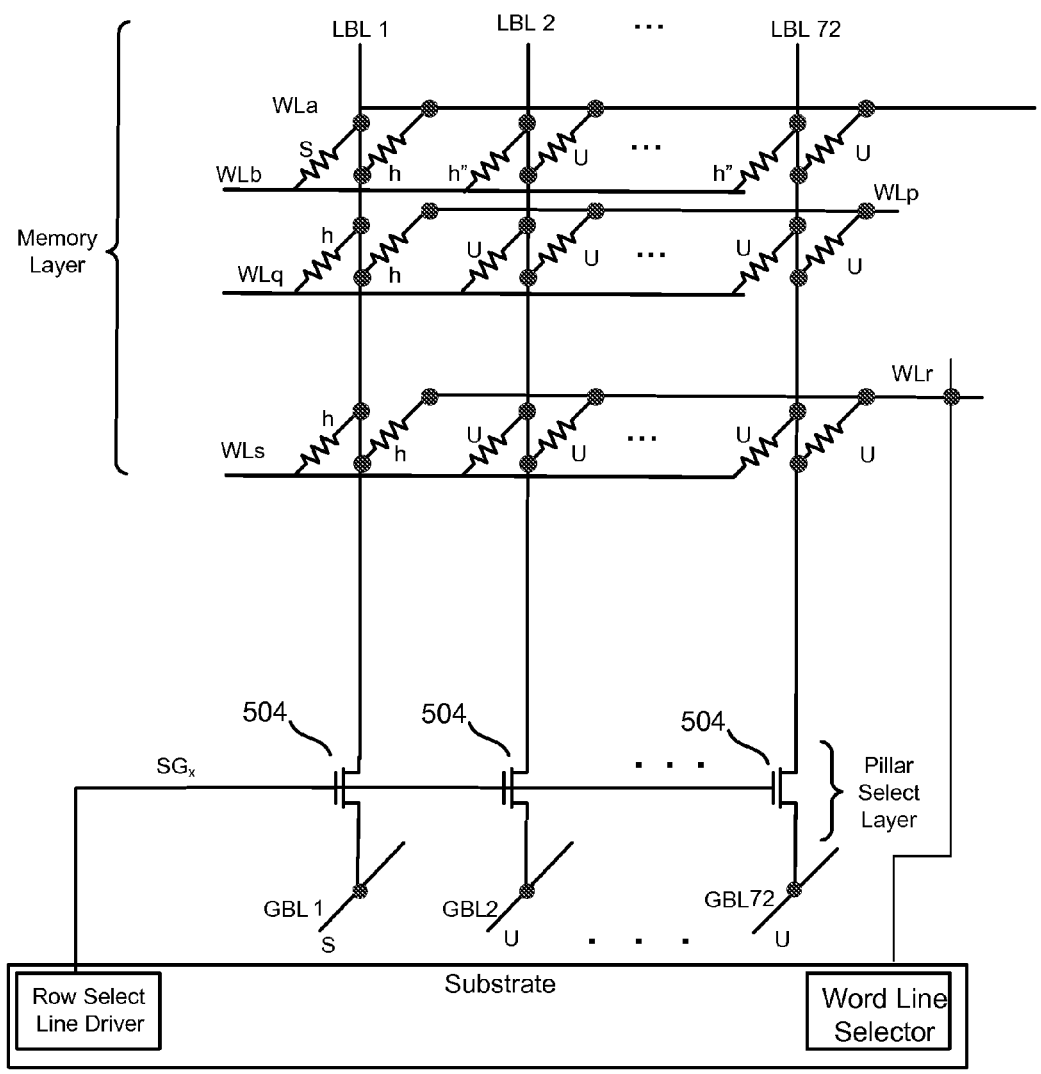
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, . . . LBL72. In this embodiment each of the word lines are connected from one side of the WL to 72 memory elements. Each of the memory elements is connected between a word line and a local bit line. Therefore, there will be 72 memory elements connected to the same word line and different bit lines (of the 72 bit lines in a row). Each of the bit lines are connected to a respective global bit line by one of the vertically oriented selector devices 504 of the Pillar Select Layer. The signal SGx driving the set of vertically oriented selector devices 504 depicted in FIG. 9 is controlled by the Row Select Line Driver. Note that the Row Select Line Driver is implemented in the substrate. The global bit lines (GBL1, GBL2, . . . GBL72) are implemented in a metal lines layer disposed above the substrate. FIG. 9 shows one slice taken along the word line direction such that each of the bit lines depicted in FIG. 9 are connected to different global bit lines via the vertically oriented select devices 504. FIG. 9 also shows one of the word lines (e.g., WLr) as being driven by a word line selector circuit that is also monolithically integrated within the substrate.

In one embodiment, pairs of neighboring word lines (e.g., WLa and WLb, WLp and WLq, WLr and WLs) will be connected to memory elements that are in turn connected to respective common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such as that word line WLb is selected for memory operation while word lines WLa, WLp, WLq, WLr and WLs are not selected. Although the enabling signal applied on row select line SGX causes all of the vertically oriented select devices 504 to connect the respective global bit lines to the respective local bit lines of FIG. 9, only the global bit line GLBL1 includes a data value that is usable for programming (as noted by the S level symbol). Global bit lines GLBL2 and GLBL72 do not include data levels sufficient for programming (as denoted by the U's). This can be due to the data pattern being stored as the global bit lines receive data dependent signals. Note that while SGx receive an enable signal, other select lines receive a disable signal to turn off their connected select devices.

Because local bit line LBL1 and word line WLb are both selected for programming, the memory element between local bit line LBL1 and word line WLb is selected for the memory operation of setting it (as noted by the S). Since local bit line LBL1 is the only bit line with program data, the other memory elements connected to WLb will be half selected (as noted by the unprimed designator, h). The double-primed designation h" indicates that half selection is occurring due to the level placed on the word line (e.g., (WLb). By half selected, it is meant that one of the control lines (either the bit line or the word line) is selected but the other control line is not selected. A half selected memory element will not undergo the memory operation. The word line WLa is not selected; therefore, the memory cell between WLa and the selected local bit line LBL1 is half selected, and the other memory elements on WLa are unselected (U). Since word lines WLp, WLq, WLr and WLs are not selected, their memory elements connected to LBL1 are half selected (h) and the other memory elements connected to those word lines are unselected (U). Similarly, the memory elements connected to selected word line WLb but not to selected local bit line LBL1 are half selected (h").

FIG. 10A is a cross-sectional view of a memory structure using the vertically oriented select device discussed above in FIGS. 1A, 3A and using the three-dimensional memory structure of FIG. 6. As described below, the memory structure of FIG. 10A is a continuous mesh array of memory elements because there are memory elements connected to both of opposed sidewalls of the bit lines and memory elements connected to both of opposed sidewalls of the word lines. At the bottom of FIG. 10A, the CMOS substrate is depicted. Implemented on the top surface of the CMOS structure are various metal layers including ML-0, ML-1, and ML-2 which are separated from one another by dielectric (not shown) and are optionally interconnected one to the next above or below by contact vias. Line 526 of metal layer ML-2 serves as a respective global bit line (GBL). The Pillar Select Layer includes two oxide layers 520 with a gate electrode forming material layer 522 sandwiched there between. The oxide layers 520 can be SiO2. The metal line of ML-2, namely, 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines SGx (e.g. SG1, SG2, ... of FIG. 1A), which are labeled in FIG. 10A as row select lines 580, 582, 584, 586, 588 and 590.

The memory layer includes a set of vertical bit lines 530 (comprising N+ polysilicon). Interspersed between the vertical bit lines 530 are stacks of alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide HfO2. However, other materials (as described above) can also be used. Dashed box 540 surrounds one example memory element which includes the reversible resistance switching material 532 sandwiched between a word line 536 and vertical bit line 530. The memory elements are positioned above, and not in, the substrate. Directly below each vertical bit line 530 are the vertically oriented select devices 504, each of which comprises (in one example embodiment) a n+/p−/n+ TFT. Each of the vertically oriented select devices 504 have gate oxide layers 505 on each side. FIG. 10A also shows an n+ polysilicon layer 524 providing connections from the TFT source regions to the underlying metal of the GBL 526. As can be seen, the npn TFT of vertically oriented select devices 504 can be used to connect the global bit line GBL (layer 526) with any of the vertical bit lines 530.

FIG. 10A shows six row select lines (SGx) 580, 582, 584, 586, 588 and 590 in the gate material layer 522, each underneath a stack of multiple word lines. As can be seen, each of the row select lines 580, 582, 584, 586, 588 and 590 is positioned between two vertically oriented select devices 504, above and not in the substrate. Therefore each row select line can provide an activating gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share a same interposed gate region. This allows the vertically oriented select devices to be closer together.

The illustrated Pillar Select layer of FIG. 10A is shown to have just a single transistor for each local bit line LBL merely for the sake simplicity. In such a single transistor per LBL case, a combination of strong turn-off gate signals and weak turn-on gate signals may be applied to the individual row select lines (SGx) 580, 582, 584, 586, 588 and 590 of the gate material layer 522. A p− channel region that is sandwiched on both of its opposed sides by row select lines (SGx) receiving strong turn-off gate signals will not be switched into an electron conducting state and thus its transistor will remain turned off. A p− channel region that is sandwiched on both of its opposed sides by row select lines (SGx) receiving weak turn-on gate signals will be switched into an electron conducting state and thus its transistor will be turned on. For immediately neighboring transistors where their respective p− channel region are sandwiched so as to receive a weak turn-on gate signal on only one side while at the same time receiving a strong turn-off gate signal on the opposed other side will be substantially kept below threshold and thus not turned on.

Accordingly, individual transistors can be selectively turned on or off even though pairs of them share an interposed common gate electrode (e.g., 582).

Figure 10B:
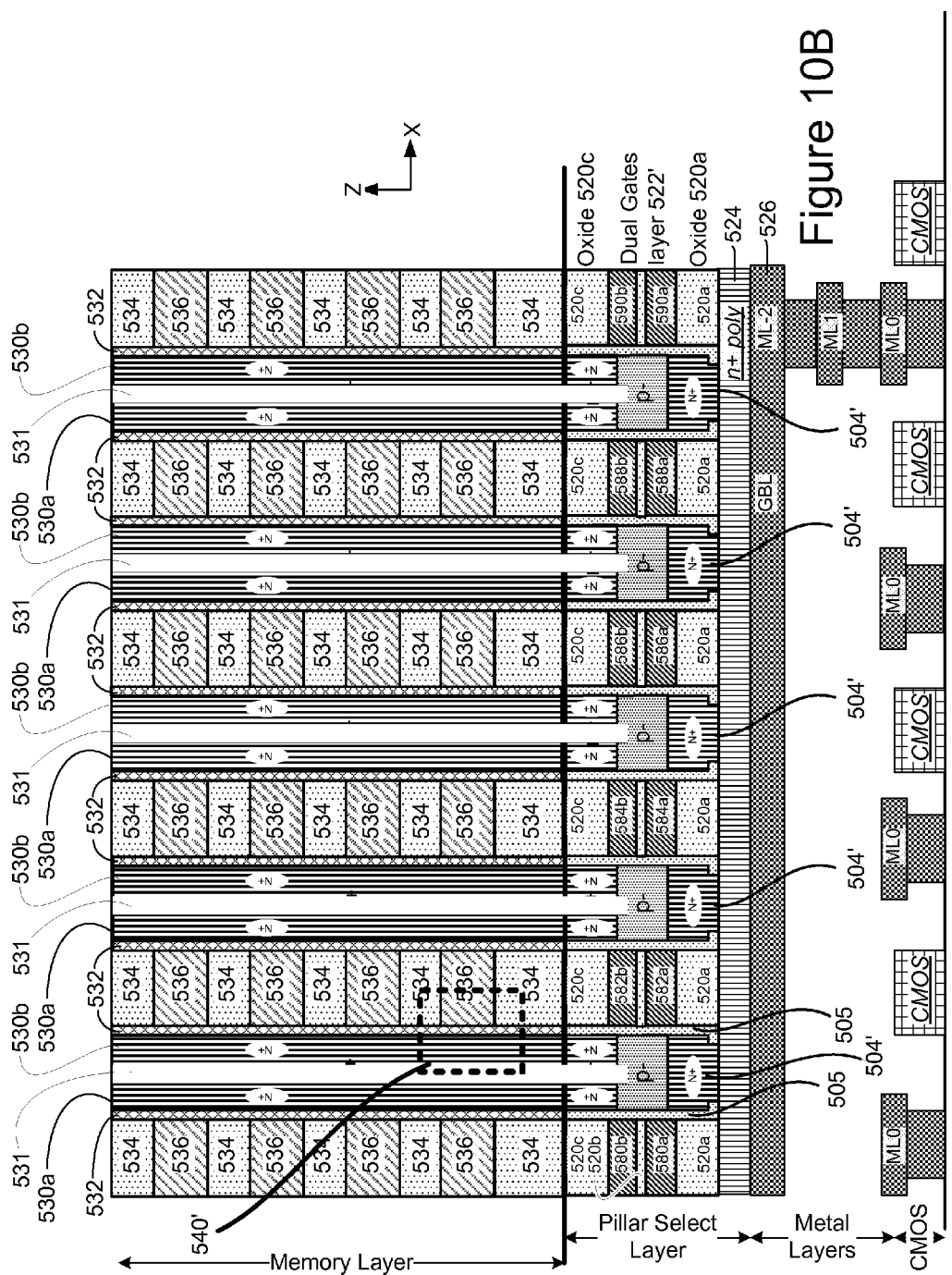
FIG. 10B illustrates one embodiment of a memory structure in accordance with FIG. 1B having vertical local bit lines above the substrate and vertically oriented select devices above the substrate that connect the bit lines to global bit lines.

Another approach, not shown in FIG. 10A is to vertically interpose between the upper oxide layer 520 and the lowest bit line oxide layer 534, another patterned layer of spaced apart gate lines (call them SGb's) with p– semiconductors and gate oxides sandwiched horizontally between these inserted SGb's (not shown) so as to define for each illustrated NPN MOSFET in FIG. 10A, yet another NPN MOSFET stacked in series above it. For such an in-series connected combination of selector transistors for each local bit line (LBL 530), all the in-series connected transistors have to be turned on in order to create a connection between the local bit line (LBL 530) and the global bit line GBL (526). In such a case, turn-on gate voltages are applied to the SGb's (not shown) in the column next adjacent to rather than in the same column whose SGx (e.g., 582) is receiving a turn-on gate voltage. In that case, only the local bit line LBL whose two in-series selector transistors are both receiving turn-on gate voltages will be connected to the global bit line (e.g., GBL 526). Alternatively, each transistor may include dual serial gate electrodes along the sidewall of the channel region as shall be seen in the case of next described FIG. 10B. FIG. 12 shows a schematic diagram of vertically stacked and series connected transistors whose gates are respectively driven by group (e.g., row) select lines SGa and SGb.

Referring to FIG. 10B, shown here is a divided local bit lines (LBL's) configuration where, for each one vertical N+ poly bit line 530 of FIG. 10A there is formed a pair (530*a*/530*b*) of immediately adjacent and isolated-from-one-another local bit lines, 530*a* and 530*b* with an isolation trench or vertical insulative layer 531 interposed between them. Additionally, in FIG. 10B, vertically extending bit line selector devices 504' are formed so as to have two gate electrodes on each sidewall of the corresponding pillar structure. For example, the leftmost of the illustrated selector devices 504' has gate electrodes 580*a* and 580*b* disposed on its left side where those gate electrodes are vertically isolated from one another by insulative layer 520*b* and are horizontally isolated from the P– channel to their right by a vertically extending gate insulator 505 (which could be gate oxide or another insulative material). Additionally, the leftmost of the illustrated selector devices 504' has gate electrodes 582*a* and 582*b* disposed on its right side in a similar vertically stacked and isolated configuration as those on the left. Moreover, gate electrodes 582*a* and 582*b* serve as the left side gate electrodes for the next adjacent selector device 504' to the right. The pattern repeats as is illustrated in FIG. 10B.

If it is desired to turn on just the leftmost of the illustrated selector devices 504', then one option is to apply turn-on gate voltages to gate electrodes 580*a* and 582*b* (diagonally opposed gate electrodes of that vertical selector device) while applying turn-off gate voltages to all the rest of the gate electrodes, including to 580*b* and 582*a*. Another option is to apply turn-on gate voltages to gate electrodes 580*b* and 582*a* (diagonally opposed gate electrodes of that vertical selector device) while applying turn-off gate voltages to all the rest of the gate electrodes. The two options are not equivalent because one steers conduction diagonally to the upper right of the P– channel and thus to bit line 530*b* of the illustrated bit line pair 530*a*/530*b* while the other option steers conduction diagonally to the upper left of the P– channel and thus to bit line 530*a* of the illustrated bit line pair 530*a*/530*b*. In one embodiment, insulative trench 531 extends from the top of the pillar and down to a level below the top of the P– channel (e.g., half way vertically into the P– channel) such that the immediately adjacent and isolated-from-one-another local bit lines, 530*a* and 530*b* are kept isolated from one another and are thus independently connectable to the global bit line GBL 526. Various other ways of driving the illustrated gate electrodes, 580*a*, 580*b*, 582*a*, 582*b*, 584*a*, 584*b*, . . . 590*b* may be used including allowing certain ones of them to float. For example, in connecting the leftmost bit line 530*a*, a device turn-on gate voltage may be applied to gate 580*b* while 580*a* floats and at the same time a device turn-on gate voltage may be applied to gate 582*a* while 582*b* floats and then all the other gate electrodes (e.g., 584*a*, 584*b*, etc.) are driven by device turn-off gate voltages. Capacitive coupling between each driven gate electrode and its vertically adjacent, but floating counterpart can cause the floating gate to acquire a charge of opposite polarity from that of the actively driven gate electrode. Before final selection is made and then the global bit lines GBL's are driven as opposed to being floated, the various gate electrodes may be pre-charge to desired levels. These are merely non-limiting examples of how the structure of FIG. 10B may be used.

Referring to dashed box 540' of FIG. 10B, the network of resistive and conductive elements present for each horizontal layer (a.k.a. a plane having thickness) of memory cells is different from the like-numbered counterparts of FIG. 10A because the isolating trenches 531 (which in one embodiment, are filled with insulative material) prevent parasitic currents from flowing endlessly about the matrix. More specifically, if a programming voltage VPGM is applied to the local bit line LBL 530*b* of the boxed memory cell and a current sinking voltage V=0 is applied to the word line (WL) 536 of the boxed memory cell, there is memory cell to the left of the boxed memory cell which will also have the programming voltage VPGM applied to it. The only further memory cells that have the programming voltage VPGM applied to them are the ones vertically above the memory cell of dashed box 540'. To prevent significant parasitic currents from flowing into these vertically above memory cells, predetermined boost voltage Vboost can be applied to their respective word lines as shall be better explained when FIG. 11B is described.

Referring to FIG. 10C, shown is a cross-sectional view of a memory structure 2500 that is somewhat similar to that depicted in FIG. 10B, except that the gate lines, SG11, SG12, . . . , etc. of FIG. 10C are not shared ones shared that are shared by successive transistors as is the case in FIG. 10B. Instead each primarily vertically extending transistor (e.g., each N-type MOSFET having an N+ drain region vertically stacked on top of an at least partly not-shared P– channel region) is controlled by its adjacent row select line (e.g., SG12). In FIG. 10C, reference numbers in the 2500 century series are used in correspondence with those of the 500 century series of FIG. 10B so that the two can be compared. One difference between FIGS. 10B and 10C is that in FIG. 10C, the P– channel regions 2504*c* abut directly against the N+ poly line 2504*s* of metal global bit line GBL 2526 whereas in FIG. 10B a vertically extending N+ source region is provided. The process step of forming a vertically extending N+ source region is avoided for the structure 2500 of FIG. 10C by instead using the N+ poly line 2504*s* of metal global bit line GBL 2526 for providing portions thereof which function as source regions.

In other words, in FIG. 10C, the P– channel region 2504*c* T-bones into a horizontal source region 2504*s*. More specifically, in the illustrated structure 2500, an N+ heavily doped polysilicon line 2524 is provided extending in the X-direction on top of a corresponding metal GBL line 2526 with an ohmic contact there between. Spaced apart pillars of alternating dielectric and conductor (e.g., metal) are formed atop the polysilicon line 2524. In the illustrated embodiment, selector gate lines 2582*a* (SG11), 2582*b* (SG12), 2584*a* (SG21) and 2584*b* (SG22) are formed on a thin dielectric layer atop the polysilicon line 2524, where the selector gate lines, SG11-SG22, extend in the Y-direction over a plurality of spaced apart N+ doped source lines similar to the illustrated one 2524 with all similarly extending in the X-direction. The selector gate lines (2582*a*-2584*b*) may be composed of heavily doped gate polysilicon and/or a metal or metal silicide. Capacitive coupling between the selector gate lines (2582*a*-2584*b*) and the under-crossing source lines (e.g., 2524) should be relatively weak while capacitive coupling between the selector gate lines (2582*a*-2584*b*) and their respectively adjacent P− channel regions (e.g., 2504*c*) should be substantially stronger. The dielectric thicknesses in the horizontal and vertical directions off the selector gate line surfaces are appropriately controlled. In one embodiment, the X-direction dimension of each SG line is substantially smaller than the Z-direction dimension and thus capacitive coupling area between gate and source is significantly reduced. In addition to the dielectric being provided between immediately adjacent selector gate lines (e.g., 2584*a*-2584*b*) and between each and its respective source and channel regions, further dielectric 2534*a* is deposited above the spaced apart selector gate lines, SG11-SG22 at least to vertical height extent planned for the drain regions (e.g., 2504*d*) and a conductive etch-back stop layer 2504*e*. In one embodiment, a CVD process such as the Applied Materials Eterna™ dielectric one is used for filling dielectric about and above the selector gate lines (2582*a*-2584*b*).

Alternating layers of unpatterned metal such as 2536*a* and dielectric such as 2534*b* are stacked one above the next, with the topmost dielectric layer 2534*e* being substantially thicker than the others. Pillars separating, deep trenches 2570, 2571 and 2572 extend from the topmost dielectric layer 2534*e* down through the N+ drain regions 2504*d* and partly into the illustrated channel regions 2504*c* so as to define immediately adjacent and isolated-from-one-another local bit lines such as 2530*b* and 2530*c*, and corresponding immediately adjacent and partly isolated-from-one-another transistors (having a shared source region 2504*s*) where insulative material and/or an air gap is interposed between the isolated-from-one-another local bit lines (e.g., 2530*b* and 2530*c*) and between the drain regions 2504*d* of their corresponding drive transistors. The separated pillars have patterned metal layers (e.g., 2536*a*, 2536*b*, 2536*c*, 2536*d*, . . . ) defining respective word lines (e.g., WL11, WL12, . . . WL23, WL24, . . . ) connecting to memory cells disposed along the vertical sidewalls of the word lines. It is understood that the illustrated number of four WL layers is merely exemplary and not limiting. It is also understood that the patterned word lines may have comb-like structures similar to the ones shown in FIG. 14 except that in the present case there will be two rows of immediately adjacent and isolated-from-one-another local bit lines (e.g., 2530*b* and 2530*c* of FIG. 10*c*) between the fingers of interleaved combs rather than just one row of bit lines.

Referring to FIG. 11A, shown is a cross-sectional view of a memory structure that is similar to that depicted in FIG. 10B, except that oxide layers 520*a*, 520*b*, 520*c* have been replaced by oxide regions 590' and gate electrodes 580*a*, 580*b*, 582*a*, etc. have been replaced by gate electrodes (row select lines) 592. Oxide regions 590' extend beneath the gate electrodes 592 so as to be interposed between the gate electrodes 592 and source line layer 524. The embodiment of FIG. 11A is referred to as the split gate structure. Each vertically oriented select device 504 is turned on by applying a high voltage to a selected one or both of its neighboring row select lines 592.

In prior designs, word line drivers were implemented in the substrate but outside the area shaded by the memory array (in other words, not underneath the memory array). To make the integrated circuit smaller, it is preferable to implement the word line drivers underneath the memory array. In some cases, a word line driver is as big in size as 16 word lines aggregated. Thus, the word line drivers have been too big to fit underneath the memory array. One proposed solution is to connect one word line driver to a group of multiple word lines connected together, where a memory system will have many of such groups. In one example implementation, 16 (or another number of) word lines will be connected together, and the connected group of word lines will be connected to a single word line driver. In one example, the 16 word lines are connected together to form a comb shape. However, other shapes can also be used. Using one word line driver to drive 16 (or a different number of) word lines in a single comb (or other shaped structure) reduces the number of word line drivers need. Therefore, the word line drivers can fit underneath and not extend beyond the footprint area of the memory array. The use of the vertically oriented select devices described above also provides more room underneath the memory array (e.g., in the substrate) in order to implement the word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines will settle quicker and there is no significant transient effect that will cause a disturbance for unselected memory elements.

Figure 13:
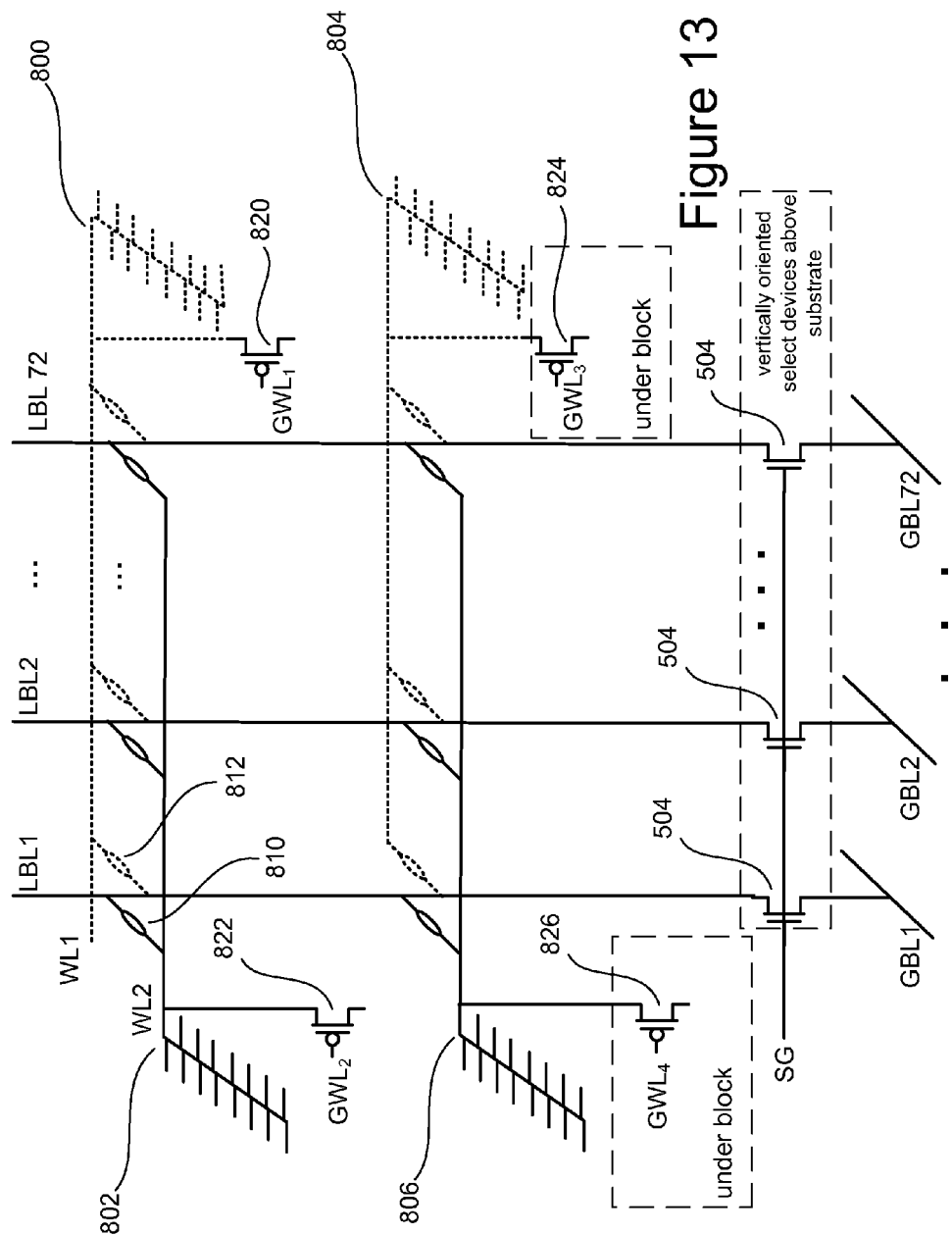
FIG. 13 is a schematic of a portion of the memory system, depicting vertical bit lines, vertically oriented select devices above the substrate and word line combs (connected word lines).

FIG. 13 is a partial schematic depicting a portion of a memory system which uses the comb structure described above. For example, FIG. 13 shows combs 800, 802, 804 and 806. A memory system is likely to have many more combs than depicted in FIG. 13; however, FIG. 13 will only show four combs to make it easier to read. Each comb includes 16 word lines, also referred to as word line fingers. For each comb, a first set such as eight (e.g., half) of the word line fingers are on a first side of the comb and are in a first block while another set such as eight (e.g., half) of the word line fingers are on the second side of the comb and are in a second block that is next to the first block. FIG. 13 shows that combs 800 and 802 (and all of the attached word line fingers) are in a first plane or level of the memory array, and combs 804 and 806 (and all of the attached word line fingers) are on a second plane or level of the memory array. Each of the combs has a signal line to one word line driver. For example, word line comb 800 is connected to word line driver 820. When word line comb 800 is selected, all of the word line fingers connected to word line comb 800 are selected (e.g., receive the selected word line signal). Word line comb 802 is connected to word line driver 822. Word line comb 804 is connected to word line driver 824. Word line comb 806 is connected to word line driver 826. Word line drivers 820, 822, 824 and 826 are implemented underneath the memory array in the substrate. In one embodiment, a word line driver is located underneath the block (or one of the blocks) for which it is connected to.

FIG. 13 shows that word line comb 800 includes word line WL1 which is connected to memory elements that are in turn connected to local bit lines LB1, LB2, . . . LB72 (72 local bit lines). Word line comb 802 includes word line WL2 that is also connected to memory elements for the same 72 local bit lines LBL1, LBL2, . . . LBL72. In this arrangement, word line comb 800 is on one side of the memory array and word line comb 802 is on the opposite side of the memory array such that the word line fingers from comb 800 are interleaved with the word line fingers of word line comb 802. To make it easier to read, FIG. 13 is created such that word line combs 800, 804, and their word line fingers appear as dotted lines to show that they are from the right side of the memory array while combs 802, 806 are solid lines to show that they are from the left side of the memory array. In this arrangement, each memory element connected to a word line of word line comb 802 for the block being depicted will have a corresponding memory element connected to a word line for word comb 800 that connects to the same local bit line. For example, in one embodiment, memory element 810 (connected to WL2) and memory element 812 (connected to WL1) are both connected to LBL1. In another embodiment, each local bit line of adjacent but isolated bit line pairs (e.g., 530*a*/530*b* of FIG. 11A) is connected to corresponding memory cells by way of only one rather than sidewalls of the bit line. In that case the dashed second memory cells such as 812 will not be connected to the same bit line that has the non-dashed cell (e.g., 810) connected to it. The system of FIG. 13 may be operated such that if LBL1 is selected, only appropriate memory element (e.g., 810) should be selected. Note that the local bit lines are connected to the appropriate global bit lines by the vertically oriented select devices 504 (described above) that are above the substrate. In other embodiments, the word line comb structure can be used without using the vertically oriented select devices. For example, the word line comb structures can be used with select devices that are implemented in the substrate.

Figure 14:
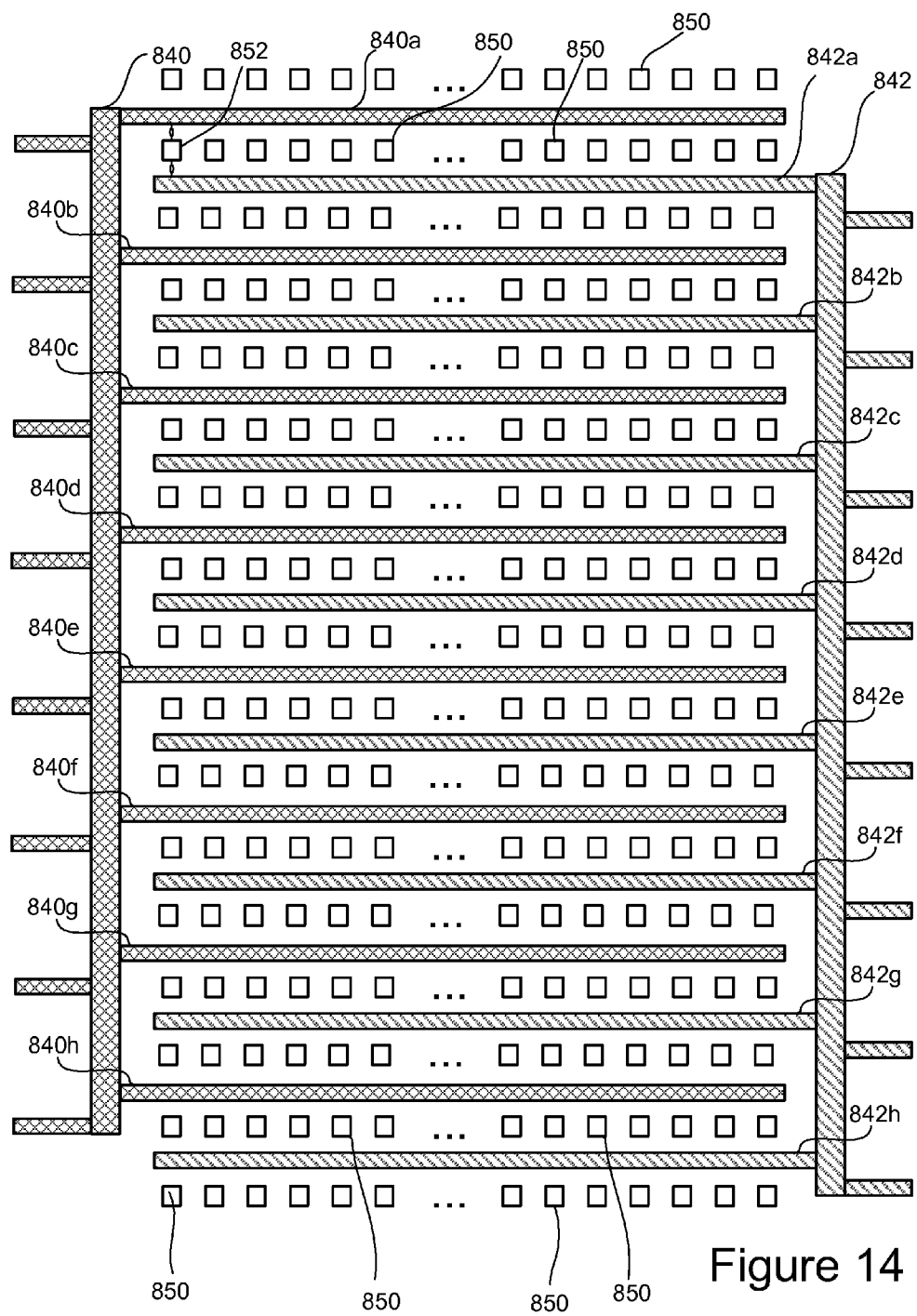
FIG. 14 is a top view showing interdigitated fingers of two word line combs and multiple vertical bit lines.

FIG. 14 is a top view of one layer of the memory array depicting part of two word line combs 840 and 842. As described above, each word line comb has word line fingers on two sides of its spine. FIG. 14 only shows the word line fingers on one side of each spine (with stubs being depicted for the word line fingers on the other side of the spine). For example, word line comb 840 includes word line fingers 840*a*, 840*b*, 840*c*, 840*d*, 840*e*, 840*f*, 840*g* and 840*h*. Word line comb 842 includes word line fingers 842*a*, 842*b*, 842*c*, 842*d*, 842*e*, 842*f*, 842*g* and 842*h*. Between adjacent word line fingers from word line combs 840 and 842 (which are interleaved as describe above), are vertical bit lines 850 (note that only a subset of vertical bit lines are labeled with reference number 850 to make the drawing easy to read). At the edge of the word line comb, the row of vertical bit lines is shared with an adjacent word line comb. Between each vertical bit line and each word line finger is a memory element. To make the drawing easy to read, memory elements are only depicted for local bit line 852.

Because two word line comb structures are interleaved and share local bit lines, biasing memory elements connected to one of the word line combs (and not the other) will have an effect on the other word line comb. Biasing the vertical bit lines will have an effect on all memory element (for any word line comb) connected to those bit lines, even though the respective word line combs are not biased. Biasing a word line comb will bias all 16 (or other number of) word line fingers that are part of that word line comb. However, it is typically desired to only program or read from memory elements connected to one word line finger of the comb.

FIG. 15A is a flow chart describing one embodiment for programming memory elements. The process of FIG. 15A can be performed as part of a SET process or as part of a RESET process. In Step 850, all word lines are driven to a common signal of ½ VPP. In general ½ Vpp represents the intermediate unselected word line voltage and is not necessarily exactly half the programming voltage Vpp. Due to IR drops and other particulars of each embodiment the intermediate unselected biases can be adjusted higher or lower than half the programming voltage and may range from ¼ to ¾ of the Vpp. In one embodiment, VPP is the largest voltage used on the integrated circuit for the memory array. One example of VPP is 4 volts; however, other values can also be used. In step 852, the local bit lines are all floated; therefore, they will drift to or near ½VPP. In step 854, ½VPP (e.g., an unselected voltage) is applied to all global bit lines. In step 856, one or more data dependent signals are applied to the global bit lines; for example, VPP is applied to only the selected global bit lines. In step 858, the vertically oriented select devices discussed above are turned on in order to connect the selected local bit lines to the selected global bit lines. In step 860, selected local bit lines will rise to or toward VPP. In step 862, the selected word line comb (or just an individual word lines) is pulled down to ground. In some embodiments more than one word line comb can be pulled down to ground. In other embodiments, only one word line comb can be selected at a time.

FIG. 15B is a flow chart describing other embodiments for programming memory elements. The process of FIG. 15B is similar to the process of FIG. 15A, except that the voltage differential experienced by the programmed memory elements has a reverse polarity. Therefore, if the process of FIG. 15A is used to SET the memory element, then the process of 15B can be can be used to RESET the memory element. Similarly, if the process of FIG. 15A is used to RESET the memory element then the process of FIG. 15B can be used to SET the memory element. In step 870 of FIG. 15B, all word lines are driven to a common signal of ½VPP. In step 872, all local bit lines are floated and they will therefore drift to at or near ½ VPP. In step 874, ½VPP is applied to the all global bit lines. In step 876, one or more data dependent signals are applied to the global bit lines; for example, the selected global bit lines are pulled down to ground. In step 878, the vertically oriented select devices are turned on to connect the selected local bit lines to the selected global bit lines. In step 880, the selected local bit lines are pulled down to or toward ground in response to being connected to the global bit lines. At step 882, VPP is then applied to the selected word line comb (or multiple word line combs in some embodiments) in order to create the appropriate differential to cause the programming operation to be performed.

FIG. 16 is a flow chart describing one embodiment of a process for reading memory elements. In step 940, all word lines are driven to a common signal of Vread. In one embodiment Vread is equal to 2 volts; however, other values can also be used. In step 942, the local bit lines are floated; therefore, they will drift to or near Vread. Some floating local bit lines will drift to a voltage just under Vread if they are connected to a memory element in the low resistance state. In step 944, the global bit lines are charged to one or more signals; for example, the global bit lines are charged to Vread. In step 946, the selected word line comb (or in some embodiments multiple word line combs) are pulled down to ground. In step 948 the appropriate vertically oriented select devices are turned on in order to connect the appropriate selected local bit lines to the selected global bit lines. In step 950, current through the selected memory element flows from the selected bit line, from the vertical select device, from the associated global bit line, through a current conveyor clamp device, and ultimately from a sense node in the associated sense amplifier. In step 952, the sense amplifier will sense the current and determine the state of the memory element.

Given the above descriptions of how resetting, setting and sensing the states of the memory cells can be accomplished by way of application of appropriate voltages to selected bit lines and selected word lines (or word line combs), reference is now made to FIG. 11B which shows one way of programming a desired memory cell (dashed box 541) while not having to charge up word lines (e.g., comb fingers) of a laterally adjacent column of memory cells.

More specifically, it is assumed that the memory cell in dashed box 541 is to be programmed by selectively supplying a programming voltage VPGM to the bit line on the left side of the respective NVM layer 532 and by selectively supplying a current sinking voltage (e.g., V=0) to the word line 536 on the right of the subject NVM region so that a programming current of desired polarity flows through the addressed memory cell (the one in box 541). To that end, the programming voltage VPGM is supplied to the metal global bit line GBL 526. A selector device turning-on gate voltage (Gate ON) is applied to the gate electrode 592 on the right side of the annotated, dual pillar region of FIG. 11B while a selector device turning-off gate voltage (Gate OFF) is applied to the gate electrode 592 on the right side. As a result, the left side bit line 530aa floats while the right side bit line 530bb has the VPGM level propagated vertically along the vertical extent of that bit line 530bb.

In order to minimize the flow of parasitic currents (and/or the formation of undesired electric fields), in one embodiment, a sink-preventing or field-reducing voltage, Vboost is selectively applied to the word lines vertically above and below the word line (536 in box 541) that is receiving the current sinking or field-creating voltage (e.g., V=0). Power is consumed in the charging up of the selected word lines to the Vboost level. The presence of the insulative vertical trench 531 within the subject pillar makes it possible to leave or set the laterally adjacent word lines (the ones on the left side of the subject pillar) to V=0 and/or to be in a floating state. As a result, the floating left side bit line 530aa is urged to the V=0 or other state of its adjacent word lines (536—the ones on the left side) if the adjacent word lines are all floated. This saves on power consumption sine only the word lines on the right side of the subject pillar need to be charged up to Vboost, with the exception of the word line 536 of the being-programmed cell (in box 541). In one embodiment, the word lines 536 on the left sides of respective pairs of immediately adjacent and isolated-from-one-another local bit lines, 530a/530b (or 530aa/530bb) are fingers of corresponding first word line combs disposed in the respective horizontal planes. At the same time, the word lines 536 on the right sides of the respective pairs of immediately adjacent and isolated-from-one-another local bit lines, 530a/530b (or 530aa/530bb) are fingers of corresponding second word line combs disposed in the respective horizontal planes. The fingers of the respective first and second word line combs may be interdigitated as described above.

Figure 17:
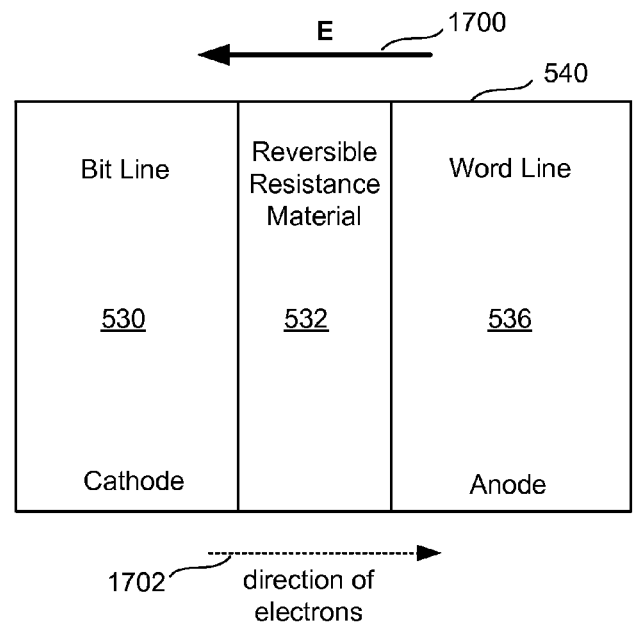
FIG. 17 is a block diagram showing a row select line driver and the associated row select line.

Reference is now made to FIG. 17. But first looking back at FIGS. 10A/10B, it is to be noted that memory element 540 is identified using a dashed box 540. FIG. 17 depicts a close-up, but not limiting, possible cross sectional configuration for the memory element of box 540. The close up shows a portion of the material comprising the bit line 530 (or 530a), reversible resistance switching material 532 and a portion of the material comprising the word line 536. The portion of the material comprising the bit line 530 (or 530a) and the portion of the material comprising the word line 536 can act as electrodes for respective terminal portions of the memory element 540.

In one embodiment, reversible resistance switching material 532 comprises a metal oxide. As described above, other types of materials can also be used. Table 1 provides some examples (but not an exhaustive list) of materials that can be used for the memory elements.

TABLE 1

| Electrode (Bit Line side) | Reversible Resistance Switching Material | Electrode (Word Line side) |
| --- | --- | --- |
| 20 nm n + Si | 3 nm (or less) AlOx | 5-10 nm TiN |
| 10 nm n + Si | 3 nm AlOx | 5-10 nm TiN |
| 20 nm n + Si | 3 nm AlOx | 5-10 nm TiN |
| 20 nm n + Si | 2 nm AlOx | 5-10 nm TiN |
| 20 nm n + Si | 2 nm HfOx | 5-10 nm n + Si |
| 20 nm n + Si | 3 nm HSiON | 5-10 nm TiN |
| 8 nm n + Si | 3 nm HSiON | 5-10 nm TiN |
| 20 nm n + Si | 3 nm TaOx | 5-10 nm TiN |
| 20 nm n + Si | 3 nm ZrOx | 5-10 nm TiN |
| 20 nm n + Si | 3 nm HfOx | 5-10 nm TiN |

In one set of example implementations, (1) 20 nm n+Si, 3 nm HfOx, 5-10 nm TiN; and (2) 20 nm n+Si, 2 nm AlOx, 5-10 nm TiN are preferred sets of materials. Thin switching materials layers are less robust to the current surges and high fields needed to form the switching material. Nevertheless, the switching material thickness in many embodiments in accordance with the present disclosure are reduced below 5 nm and preferably below 3 nm when in combination with a cathode electrode material with a low electron injection energy barrier to the switching material. Material choices are envisioned where the thickness of the switching material is reduced from typical values to be less than 3 nm and the cathode electrode material for forming has an energy barrier less than 1 eV to the switching material. Without being bound by any particular theory, the beneficial effect can be significant because both the material thickness reduction and the electron injection energy barrier reduction reduce the energy released in the forming event by electrons being injected into the switching material. Higher endurance and retention memory element are achieved.

Other buffer and barrier layers as may be required for processing and cell reliability can be added in some embodiments. For example, there may be a nm scale Titanium Oxide layer above or below the TiN layers. These buffer and barrier layers may be off ideal stoichiometry.

The thicknesses are examples but various embodiments may be higher or lower. Highly defected metal oxide such as HfSiON, AlON, or AL doped HfOx are desirable in some embodiments for lower voltage operation and highest data retention memory cells.

Even with the same structure, the process condition such as annealing temperature and time can make a difference. In the example of 20 nm n+Si/3 nm HfO2/10 nm n+Si, the annealing condition after HfOx deposition should be at lower temperature and longer time (e.g., ~540 C for 1 hour). The device after this annealing behaves differently than previous standard 750 C 60 s RTA.

Figure 18:
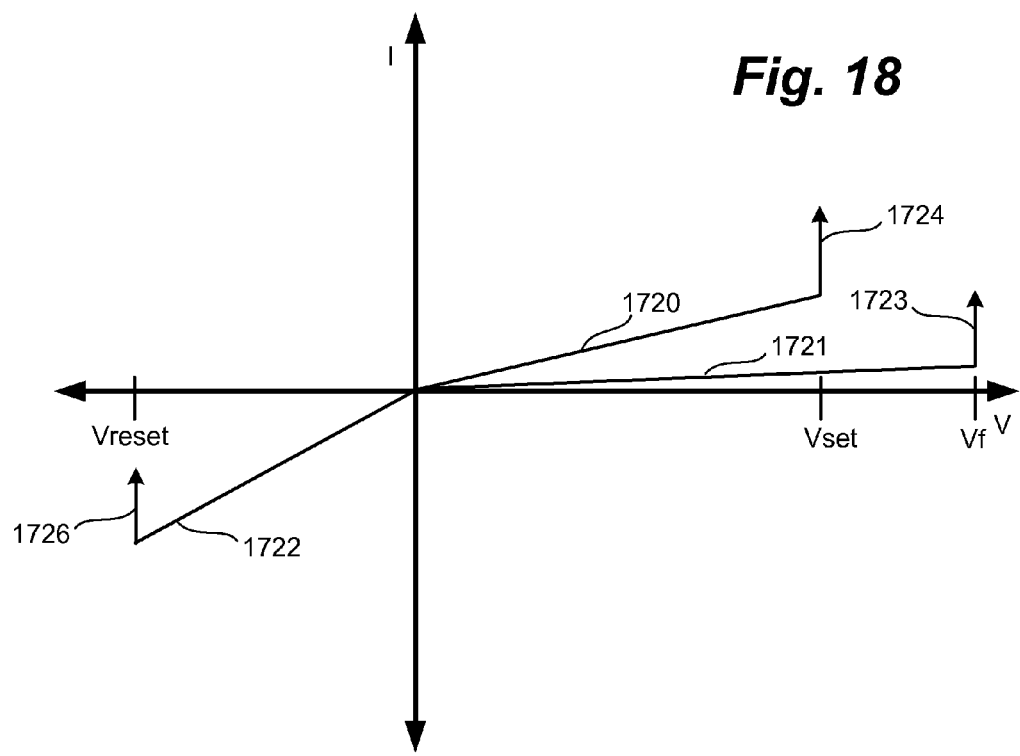
FIG. 18 is a schematic of a portion of the memory system, depicting vertical bit lines, vertically oriented select devices above the substrate, word line combs, and row select lines that run across multiple blocks of memory elements.

As described above, memory element 540 may be reversibly switched between two or more states. For example, the reversible resistance material 532 may be in an initial high resistance state upon fabrication that is switchable to a low resistance state upon application of a first voltage and/or current. Application of a second voltage and/or current may return the reversible resistivity-switching material to a high resistance state. FIG. 18 is a graph of voltage versus current for one example embodiment of a metal oxide reversible resistance-switching memory element. Line 1720 represents the I-V characteristics of the reversible resistance-switching memory element when in the high resistance state (ROFF). Line 1722 represents the I-V characteristics of the reversible resistance-switching memory element when in the low resistance state (RON). Line 1721 represents the I-V characteristics of a fresh reversible resistance-switching memory element after forming but prior to resetting and setting of its switchable-to states.

To determine which state the reversible resistance-switching memory element is in, a voltage is applied and the resulting current is measured. A higher measured current indicates that the reversible resistance-switching memory element is in the low resistance state. A comparatively lower measured current (for the same driving voltage) indicates that the memory element is in the high resistance state. Note that other variations of a memory element having different I-V characteristics can also be used with the technology herein. In bipolar switching mode of operation suitable for many materials, the values of Vset and Vreset are opposite in polarity.

Before forming, a reversible resistance-switching memory element is considered fresh. If the forming voltage Vf and sufficient current is applied to a fresh reversible resistance-switching memory element, the memory element will be formed and will go into a low resistance condition (which, in some embodiments coincides with the low resistance state). Line 1723 shows the behavior when Vf is applied. The voltage will remain somewhat constant and the current will increase. At some point, the reversible resistance-switching memory element will be in the low resistance condition/state and the device behavior will be based on line 1722 or something like line 1722.

While in the high low resistance state (see line 1720), if the voltage Vset and sufficient current is applied, the memory element will be SET to the low resistance state. Line 1724 shows the behavior when Vset is applied. The voltage will remain somewhat constant and the current will increase. At some point, the reversible resistance-switching memory element will be SET to the low resistance state and the device behavior will be based on line 1722.

While in the low resistance state (see line 1722), if the voltage Vreset and sufficient current is applied, the memory element will be RESET to the high resistance state. Line 1726 shows the behavior when Vreset is applied. At some point, the memory element will be RESET and the device behavior will be based on line 1720. Note that in one embodiment, the magnitude of the forming voltage Vf may be greater than the magnitude of Vset, and the magnitude of Vset may be greater than the magnitude of Vreset.

In one embodiment, Vset is approximately 3.5 volts, Vreset is approximately −2 volts, Iset_limit is approximately 5 uA and the Ireset current could be as high as 30 uA.

Looking back at FIG. 17, the thickness of the reversible resistance material 532 is chosen so that the fresh memory element (before a FORMING process) is in range of 10 to 1000 times more resistive than desired high resistance state (after a RESET operation). In one embodiment, the thickness range is 3 nm or less; however, other ranges can also be used.

The materials of the memory element 540 (portion of the material comprising the bit line 530, reversible resistance switching material 532 and portion of the material comprising the word line 536) each have a work function (based on the conduction bands of a semiconducting material or an electron affinity if a metallic material). When designing a memory element, the reversible resistance switching material 532 and the cathode are chosen so that electron injection energy barrier is less than 1 eV by matching work function of the electrode and electron affinity of the reversible resistance switching material 532, by reducing effective work function of the electrode, or by both effects.

In one embodiment, when creating the electrode (e.g., creating the vertical bit line), the silicon material is annealed. The annealing conditions are chosen to reduce trap depth of the reversible resistance switching material 532 to less than 1.0 eV. This is applicable if MeOx bulk conduction is dominated. Proper annealing conditions may also reduce the effective work function. Additionally (and optionally), cathode deposition conditions can be chosen to produce an interface layer between the cathode (e.g. bit line) and the reversible resistance switching material 532 which reduces effective work function of the cathode. Sputtering (e.g., Argon sputtering) can be used to reduce the work function of the electrode.

In some embodiments, the bit line can serve as the cathode and the word line as the anode, while in other embodiments the bit line can serve as the anode and the word line can serve as the cathode.

In one example implementation, the polarity of the FORMING voltage Vf is chosen so that the electrode with the lowest electrode to reversible resistance switching material barrier is chosen as the cathode. That is, the bit line to the reversible resistance switching material has a first electron injection energy barrier and the word line to the reversible resistance switching material has a second electron injection energy barrier. If the first electron injection energy barrier is less than the second electron injection energy barrier, then the bit line will be used as the cathode and the word line will be used as the anode. To achieve this, a positive forming voltage Vf is applied to the word line and ground is applied to the bit line. Alternatively, a higher positive voltage is applied to the word line, as compared to the bit line, such the difference in potential between the word line and the bit line is the forming voltage Vf. The bit line would be at a lower positive voltage potential than the word line. When the bit line serves as the cathode, the direction of the electric field is from the word line to the bit line (see arrow 1700 of FIG. 22) and the direction of electron injection into the reversible resistance switching material 532 is from the bit line to the word line (see arrow 1702 of FIG. 17). The cathode serves to emit electrons.

If the second electron injection energy barrier is less than the first electron injection energy barrier, then the word line will be used as the cathode and the bit line will be used as the anode. To achieve this, the positive forming voltage Vf is applied to the bit line and ground is applied to the word line. Alternatively, a higher positive voltage is applied to the bit line, as compared to the word line, such the difference in potential between the bit line and the word line is the forming voltage Vf. The word line would be at a lower voltage potential than the bit line.

Figure 19:
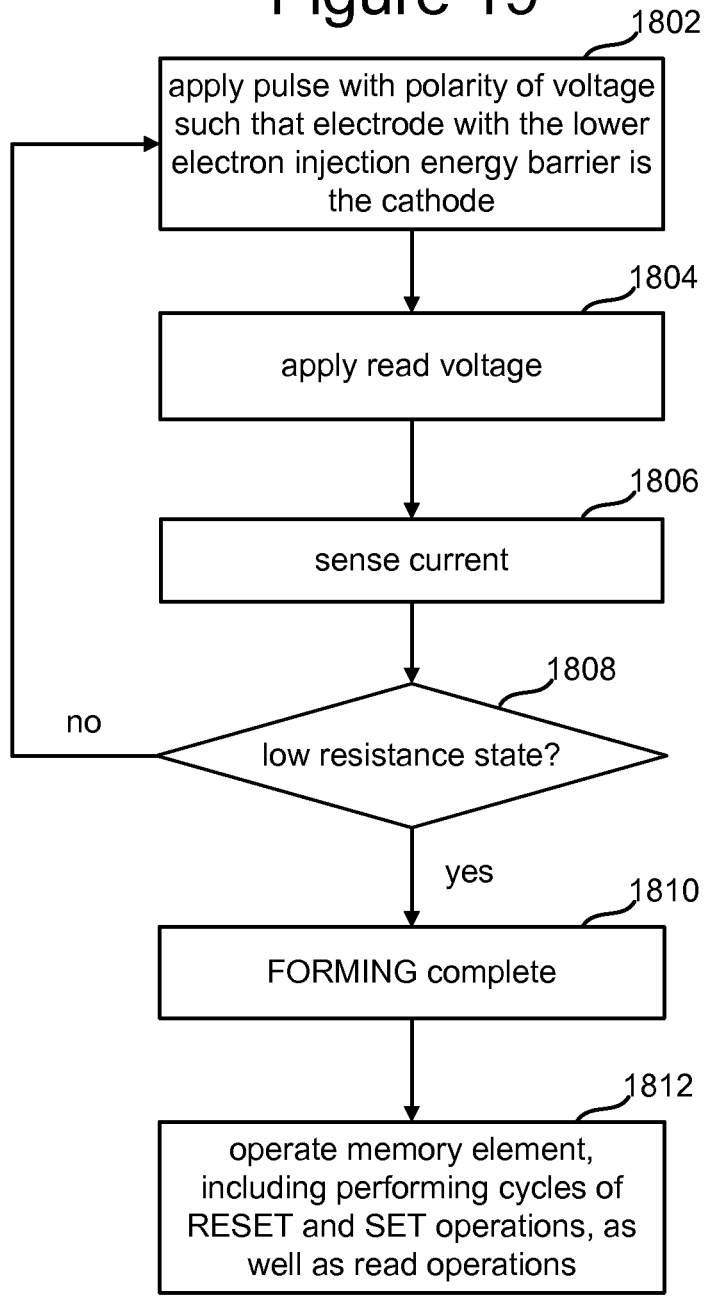
FIG. 19 is a flow chart describing one embodiment of a process for FORMING.

FIG. 19 is a flow chart describing one embodiment of a process for FORMING. In step 1802, the forming voltage Vf is applied as a pulse to the memory element via the appropriate word line and bit line. The polarity of the voltage is such that the electrode with the lower electron injection energy barrier is the cathode, as described above. In one example, the pulse is at 4.7 volts for approximately 2 micro seconds. In step 1804, a read voltage is applied to the memory element. In step 1806, the current through the memory element (and through the bit line) in response to the read voltage is sensed. If the current sensed in step 1806 is a lower current, indicating that the memory element is still in a high resistance condition (see step 1808), then the process loops back to step 1802 and another pulse is applied. If the current sensed in step 1806 is a higher current, indicating that the memory element is in the low resistance state (see step 1808), then FORMING is complete (step 1810). After FORMING is complete, the memory element can be operated by performing cycles of RESETs and SETS, as well as read processes.

In one embodiment, the system will use an on-chip resistor (or equivalent) serially connected with the memory element, with a resistance in range 100 K ohm to 500 K ohm, during FORMING to limit the maximum current across the reversible resistance switching material and, therefore, produce a formed state (low resistance) in 100M ohm to 10 G ohm. One option for an effective resistance serially connected to the memory element is to use an on-chip transistor connected with the memory at its drain to control maximum current in the range of 10 nA to 1 uA during FORMING to produce the formed low resistance state in 100M ohm to 10 G ohm. For example, the vertically oriented select devices (e.g., Qxx of FIGS. 1A/1B) can be used to limit the current in/through the vertical bit lines during the FORMING process. As described above, the select devices are transistors, such as thin film transistors (as well as other types of transistors). These transistors have threshold voltages such that when a high enough voltage is applied to the gate, the transistors turn on. An "ON" voltage is defined as the gate voltage used to sufficiently turn on the transistor such that the transistor allows the maximum current to flow in its channel without breaking the transistor. An "OFF" voltage is defined as the gate voltage for which no current (or a sufficiently small amount of current to effectively be considered no current) flows in the channel of the transistor. An "INTERMEDIATE" voltage is defined as a gate voltage greater than the OFF voltage and less than the ON voltage such that a limited current flows in the channel of the transistors. For example, the "INTERMEDIATE" voltage may only allow 50% (or 30%, 60% or other fraction) of the maximum current to flow in the channel of the transistor/switch. Since the channel of the transistor is in series with the vertical bit line, limiting the current in the channel of the transistor comprising the select device will limit the current through the connected bit line. In one embodiment, the bit line current during forming is limited to a range of 10 nano amps to 1 micro amp.

In one example, the SET voltage Vset is the same polarity as the FORMING voltage Vf, and the RESET voltage Vreset is the opposite polarity as the FORMING voltage Vf. FIGS. 15A and 15B describe the SET and RESET processes. In one example, the bit line electron injection energy barrier is lower than the word line electron injection energy barrier, such that the bit line serves as the cathode; therefore, the FORMING voltage is applied with a positive (or higher) potential at the word line, the process of FIG. 15B is used to SET and the process of FIG. 15A is used to RESET.

In another example, the word line electron injection energy barrier is lower than the bit line electron injection energy barrier, such that the word line serves as the cathode; therefore, the FORMING voltage is applied with a positive (or higher) potential at the bit line, the process of FIG. 15A is used to SET and the process of FIG. 15B is used to RESET.

A memory cell with thinner MeOx layer and lower effective electron injection energy barrier is formed in the direction of polarity with lower electron injection energy barrier. Therefore, it reduces forming voltage and surge current. A current limit, such as the select device described above, can further protect the memory element to operate in the high resistance state (1M ohm to 1000M ohm) in both SET and RESET operation. This ensures that memory element takes most of the voltage applied. Therefore, a lower voltage is required from the power source, resulting in less operational current. In this way, the operational voltage and current are reduced.

Looking back at FIG. 11A, a split gate architecture was described there. While this design does work well, it has some drawbacks in that the architecture limits the ability to scale the memory design and can result in a lower than ideal Idsat. Additionally, in some implementations, the TFT-gate thickness is so thin (e.g., ~10 nm) that the sheet-resistor of TFT-gate is very high (~2K ohm/sq). Then, the RC switching delay of the selected TFT gate is very long (e.g., >1 us) to reduce the READ/WRITE performance. Therefore, in an array design, TFT-gate has to be segmented frequently to reduce RC with die size penalty.

To solving above problems, there is a "shared-gate VTFT structure" as shown in FIGS. 10A/10B. The VTFT-gate (Vertical Thin Film Transistor) is shared between adjacent vertically bit lines (VBL's) at the same side. The shared-gate VTFT (Vertical Thin Film Transistor) structure is able to solve the three challenges noted above for the split gate architecture. However, in some cases, the shared-gate VTFT structure can suffer from unwanted disturbs on half selected vertical bit lines.

Figure 21A:
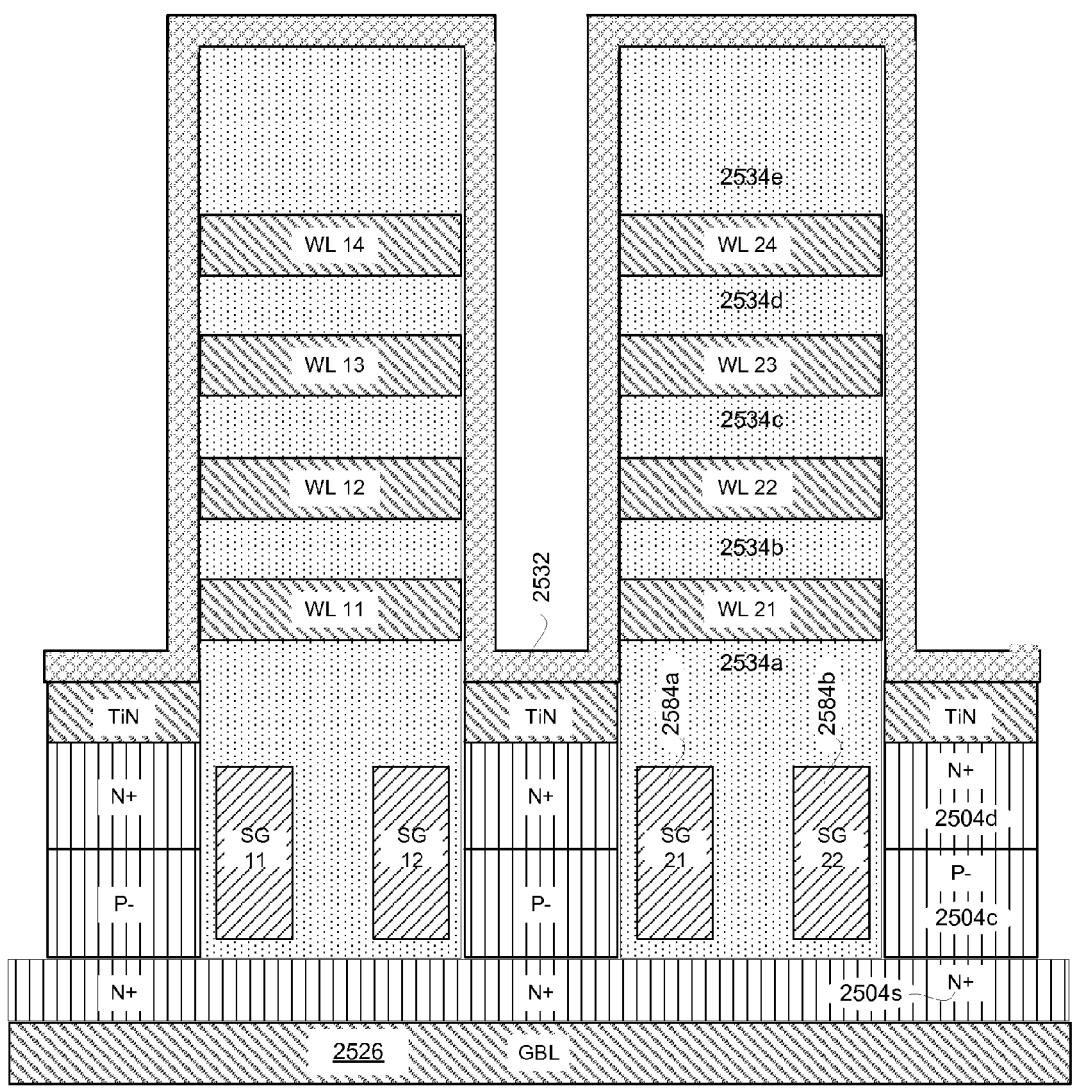
FIGS. 21A and 21B show the results of two interrelated process steps applied to the intermediate structure of FIG. 20.
Figure 21B:
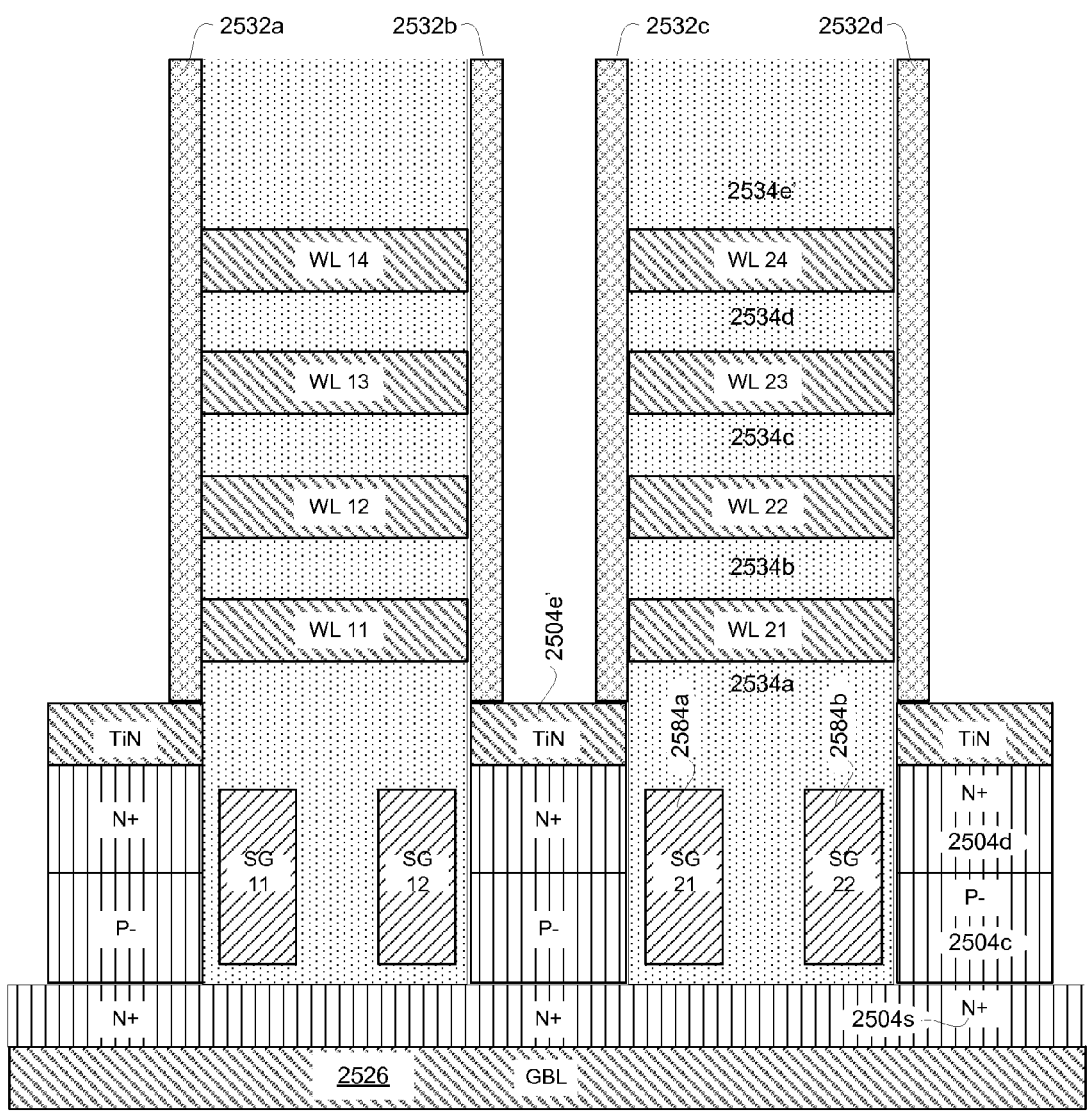
Figure 22A:
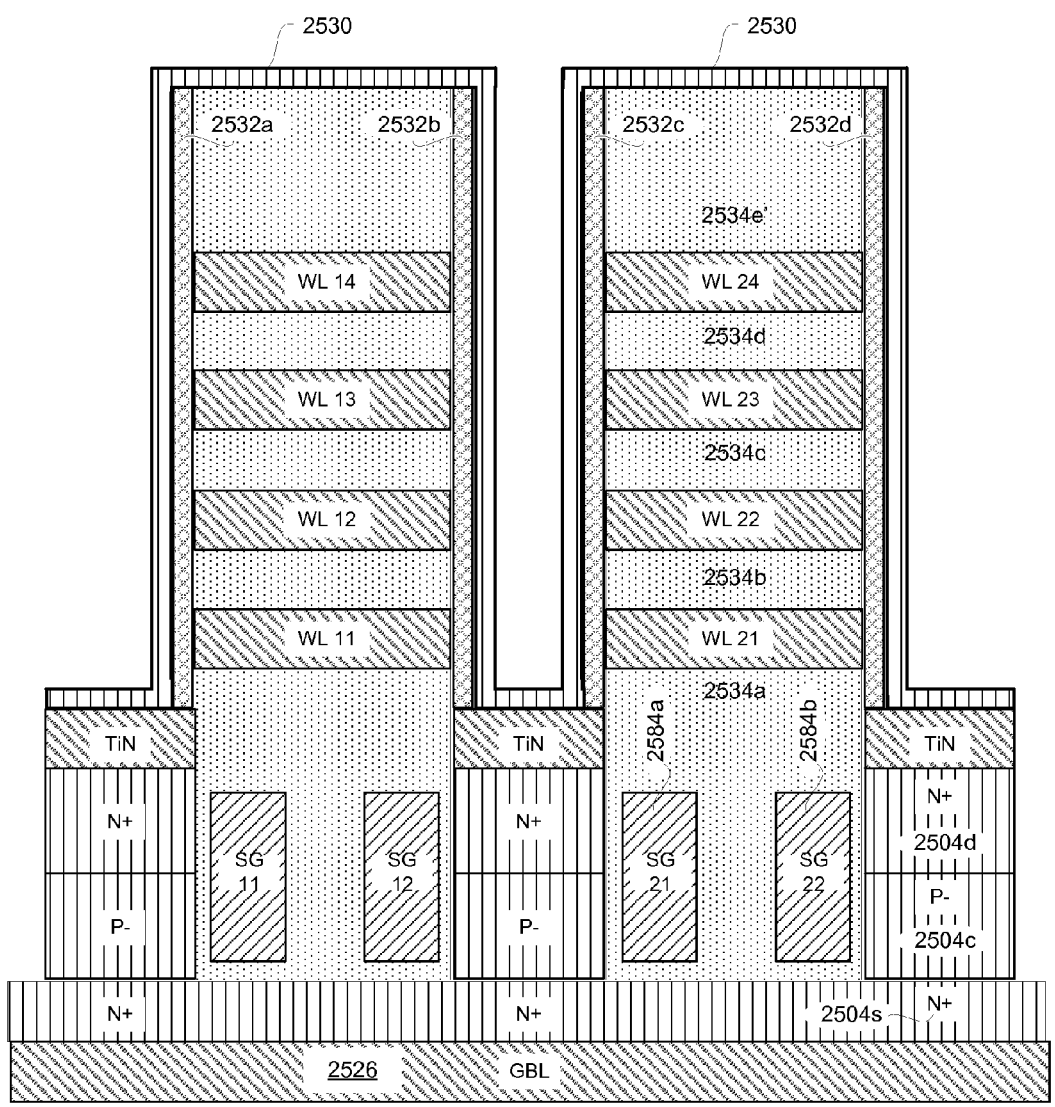
FIGS. 22A and 22B show the results of two interrelated process steps applied to the intermediate structure of FIG. 21B.
Figure 22B:
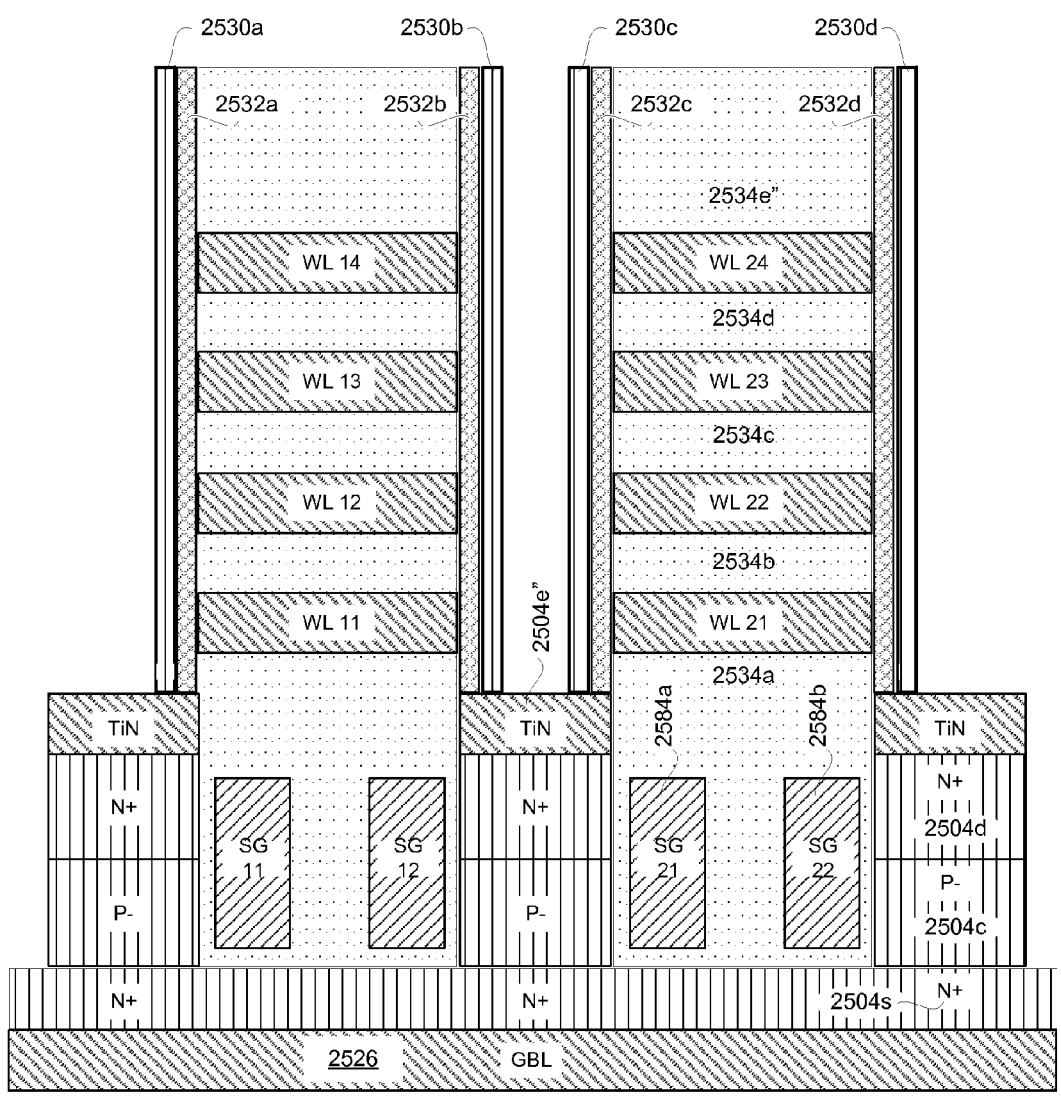
Figure 23A:
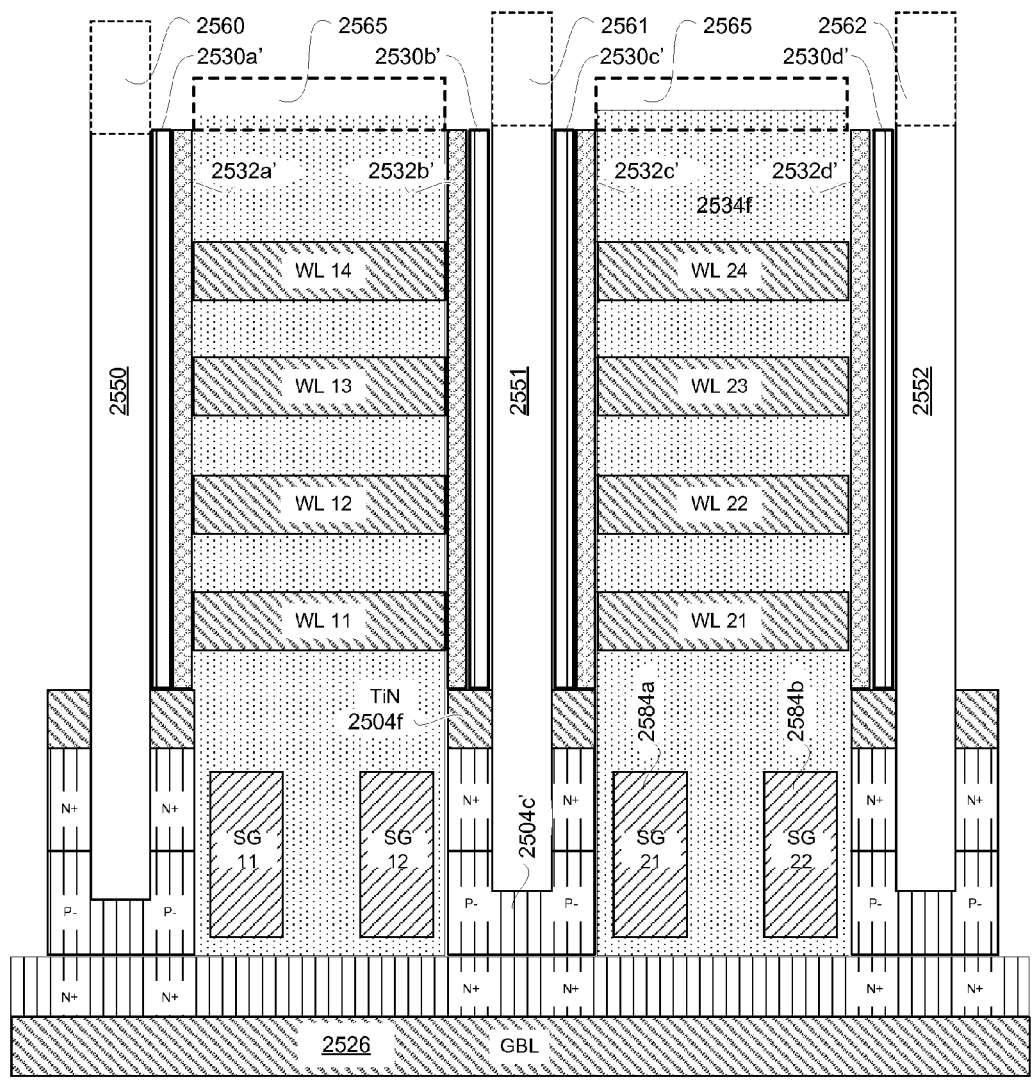
FIGS. 23A and 23B show the results of two interrelated process steps applied to the intermediate structure of FIG. 22B.
Figure 23B:
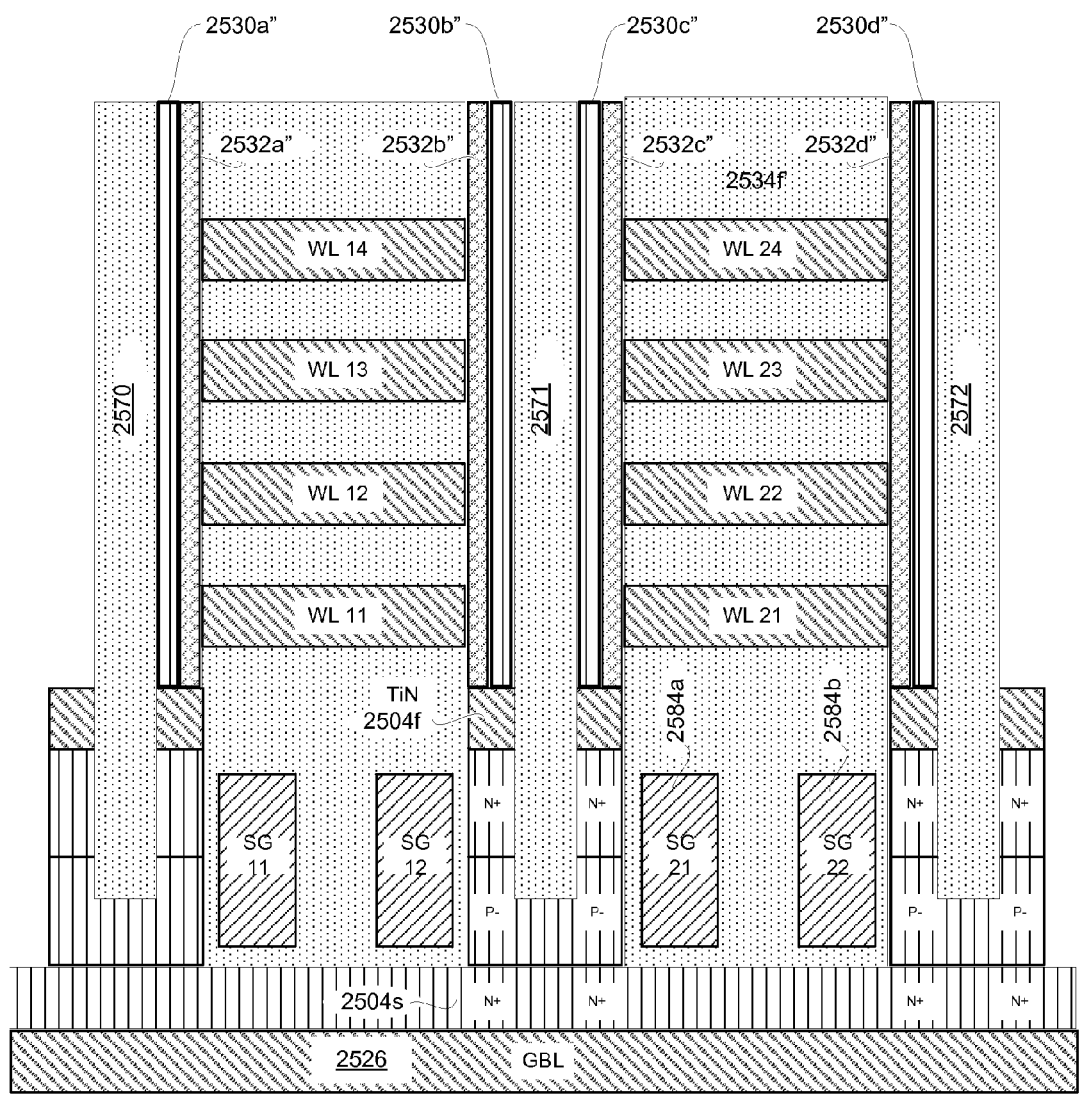

FIGS. 20, 21A-21B, 22A-22B and 23A-23B provide respective cross sectional views of a process of forming a three-dimensional memory device similar such as that shown in FIG. 10C. A similar process may be used to form the structure of FIGS. 11A-11B. The difference between FIGS. 11A-11B versus 10C/20-23B is that in the latter ones the deep trench is shown extending down only partially into the P− channel region while in the former (11A-11B) the deep trench extends fully through the P− channel region into vertical source region. An advantage of etching down only partially into the channel region as shown in FIGS. 20-23B is that less process time and materials are consumed by not going deeper. Sufficient isolation between the partly spilt-apart bit line selector devices may be obtained without cutting through the source regions. In the embodiment of FIGS. 20-23B, the P− channel region T-bones into a horizontal source region 2504s. It is within the contemplation of the present disclosure to provide embodiments with different extents of the deep trench (2571 in FIG. 23B) from those extending down only partially into the P− channel region (per FIG. 23B) to those extending partially into the source region (per FIGS. 11A-11B) and even to those where the deep trench extends down to the level of the global bit line (e.g., GBL 2526). The formation of immediately adjacent and isolated-from-one-another local bit lines, such as 530a and 530b in FIG. 11A and such as 2530b″ and 2530c″ in FIG. 23B is basically the same. For FIGS. 20, 21A-21B, 22A-22B and 23A-23B reference numbers in the 2500 century series are used in correspondence with those of the 500 century series of FIG. 11A. Accordingly, repetitive ones of details are left out here.

Figure 20:
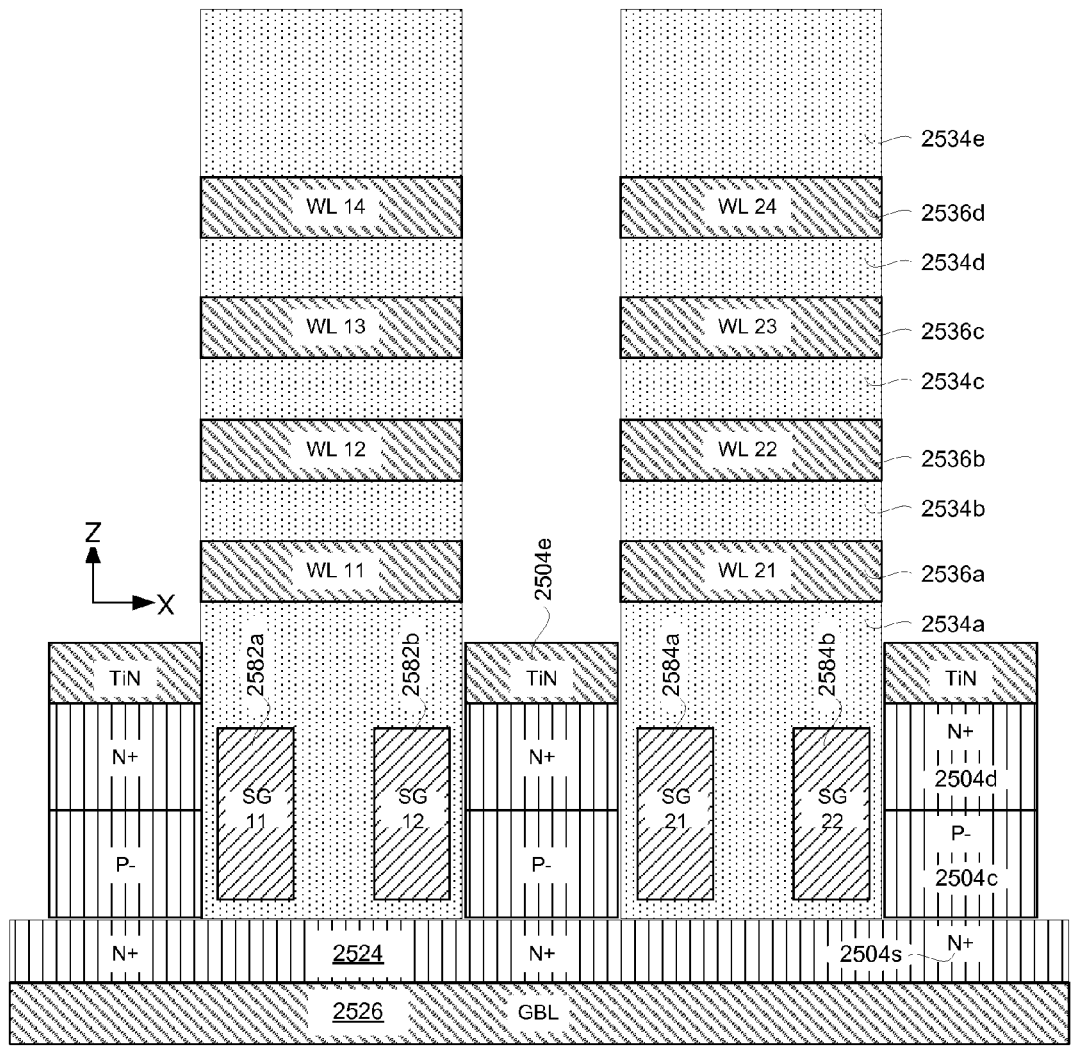
FIG. 20 is a cross sectional view of an intermediate structure used to form a memory array in accordance with the one shown in FIG. 10C.

Starting with FIG. 20, an N+ heavily doped polysilicon line 2524 is provided extending in the X-direction on top of a corresponding metal GBL line 2526 with an ohmic contact there between. Spaced apart pillars of alternating dielectric and conductor (e.g., metal) are formed atop the polysilicon line 2524. In the illustrated embodiment, selector gate lines 2582a (SG11), 2582b (SG12), 2584a (SG21) and 2584b (SG22) are formed on a thin dielectric layer atop the polysilicon line 2524, where the selector gate lines, SG11-SG22, extend in the Y-direction over a plurality of spaced apart N+ doped source lines similar to the illustrated one 2524 with all similarly extending in the X-direction. The selector gate lines (2582a-2584b) may be composed of heavily doped gate polysilicon and/or a metal or metal silicide. Capacitive coupling between the selector gate lines (2582a-2584b) and the undercrossing source lines (e.g., 2524) should be relatively weak while capacitive coupling between the selector gate lines (2582a-2584b) and their respectively adjacent P− channel regions (e.g., 2504c) should be substantially stronger. The dielectric thicknesses in the horizontal and vertical directions off the selector gate line surfaces are appropriately controlled. In addition to the dielectric between immediately adjacent selector gate lines (e.g., 2584a-2584b) and between each and its respective source and channel regions, further dielectric 2534a is deposited above the spaced apart selector gate lines, SG11-SG22 at least to vertical height extent planned for the drain regions (e.g., 2504d) and an etch-back stop layer 2504e. In one embodiment, a CVD process such as the Applied Materials Eterna™ dielectric one is used for filling dielectric about and above the selector gate lines (2582a-2584b).

Alternating layers of unpatterned metal such as 2536a and dielectric such as 2534b are stacked one above the next, with the topmost dielectric layer 2534e being substantially thicker than the others. A first trench-forming etch (not shown) extends from the topmost dielectric layer 2534e down to the N+ polysilicon lines 2524 (one shown) so as to form the illustrated pillars having their metal layers (e.g., 2536a, 2536b, 2536c, 2536d, . . . ) patterned to define respective ones of patterned word lines (e.g., WL11, WL12, . . . WL23, WL24, . . . ) where it is understood that the illustrated number of four such layers is merely exemplary and not limiting. It is also understood that the patterned word lines may have comb-like structures similar to the ones shown in FIG. 14 except that in the present case there will be two rows of immediately adjacent and isolated-from-one-another local bit lines (e.g., 2530b and 2530c of FIG. 23B) between the fingers of inter-leaved combs rather than just one row of bit lines.

Still referring to FIG. 20, into the bottoms of the first formed trenches there is deposited a P− doped polysilicon layer 2504c that will define channel regions (c) of respective, upside down T-shaped transistors where the N+ regions like 2504s of N+ polysilicon line 2524 define the horizontal cross bars of the T-shapes and serve as the respective sources of such being formed transistors. Next an N+ doped polysilicon layer 2504d is deposited to form the respective transistor drains (d). The recited order of depositions and masked etch-ings can be varied and one is described here is merely for illustration.

Next an etch stop layer 2504e such as one composed of TiN is deposited into the trenches atop the N+ doped polysilicon drain areas 2504d. This is followed by a second selective etch that creates smaller trenches spaced apart in the Y-direction (not shown, into the plane of the drawing) between the formed TiN topped transistors (2504) of the respective global bit lines (GBL's) 2526. The smaller trenches are filled with an appropriate dielectric.

Next, in FIG. 21A, a predetermined NVM cell forming material 2532 such as HfO is isotropically deposited to a pre-specified thickness on the formed pillars including on their sidewalls.

Referring to FIG. 21B, a selective and anisotropic back etch is performed on the deposited NVM cell forming material 2532 using the topmost thicker dielectric 2534e' and also the TiN layer 2504e' as etch stops. The once exposed-to-back-etch reference numbers of dielectric 2534e' and TiN regions 2504e' are primed to indicate that they have been subjected to an etching environment. The anisotropic back etch leaves behind vertically rising layers 2532a, 2532b, 2532c and 2532d, of the NVM cell forming material on the sidewalls of the stacked word line pillars as shown in FIG. 21B.

Next, in FIG. 22A, a predetermined bit line forming material 2530 such as N+ doped polysilicon is isotropically deposited to a pre-specified thickness.

Subsequently, in FIG. 22B, a selective and anisotropic back etch is performed on the deposited bit line forming material 2530 using the topmost thicker dielectric 2534e'' and also the TiN layer 2504e'' as etch stops. The twice exposed to back etch reference numbers of dielectric 2534e'' and TiN regions 2504e'' are twice-primed to indicate that they have been at least twice subjected to etchings. The anisotropic back etch leaves behind vertically rising layers 2530a, 2530b, 2530c and 2530d, on the NVM cell forming material layers already formed on the sidewalls of the stacked word line pillars as shown in FIG. 22B.

Referring to FIG. 23A, a photo mask with narrower slits than used before is used for a further selective, anisotropic and this time a deep etch is performed down at least to a level below the tops of the P− doped polysilicon channel regions 2504c'. The prime in reference number 2504c' indicates here that the deep etch has breached into the layer of the P− doped polysilicon channel regions. (As explained in various sections here, it is within the contemplation of the present disclosure to vary the depth of the deep etch so that, for example; in the slightly different case of FIG. 11A, the deep etch extends into the N+ source regions. In yet another embodiment (not shown), the deep etch may extend to the level of the tops of the GBL lines 2526.)

Reference numbers 2550, 2551 and 2552 of FIG. 23A indicate the areas of the formed deep trenches in the illustrated embodiment 2300a. The deep etch is designed to cut through the TiN layers (now referenced as 25040 and to remove some of top material on the upper thick dielectric (now referenced as 25340. Removal of some of the top material on the upper thick dielectric is represented by dashed boxes 2565. Additionally, the heights of the bit lines 2530a'-2530d' and of the NVM cell forming material layers 2532a'-24532d' might altered by the aggressive deep etch process, thus possibly resulting in a nonplanar top surface for the device 2300a.

In FIG. 23B, the deep trenches 2550, 2551 and 2552 are filled with an appropriate dielectric such as an Applied Materials Eterna™ dielectric to thereby produce inter-pillar isolation regions 2570, 2571 and 2572 and the top of the insulator-filled structure (2300b) is planarized for example with an appropriate CMP process. In an alternate embodiment, the trenches are not filled so as to thereby leave behind air-filled inter-pillar isolation regions.

As seen in FIG. 23B, the produced structure 2300b comprises pairs of immediately adjacent and isolated-from-one-another local bit lines such as 2530b'' and 2530c'' each having a respective vertically oriented selector device (e.g., the transistors controlled by SG12 and SG21). In the illustrated embodiment 2300b, the respective vertically oriented selector devices of the bit line pairs (e.g., 2530b'' and 2530c'') share a wide source region 2504s that makes wide ohmic contact with the underlying metal line 2526 of the corresponding global bit line (GBL). Thus the drain-to-source resistance (RdsON) of each vertically oriented selector device is reduced due to the sharing of the wide source region 2504s. In an alternate embodiment, the deep trenches 2550, 2551 and 2552 of FIG. 23A may be bored deeper down to penetrate below the top of the layer 2504s (thus fully dividing the P− channel regions) or even deeper down to hit the GBL metal lines 2526 (thus fully dividing the respective vertically oriented selector devices of the pairs of immediately adjacent and isolated-from-one-another local bit lines such as 2530b'' and 2530c''. In yet another embodiment, the structure 2200b of FIG. 22B has a further layer (not shown) of predetermined thickness deposited on it and then etched back where the further layer is a metallic one that can adhere to the polysilicon material of bit lines 2530a-2530d (for example by forming a bonding silicide) and can reduce the resistances of the resulting and vertically extending, local bit lines (LBL's).

The foregoing detailed description has been presented for purposes of illustration and description. It is not intended to be exhaustive or limiting to the precise form disclosed. Many modifications and variations are possible in light of the above teachings. The described embodiments were chosen in order to best explain the principles of the disclosed technology and its practical application, to thereby enable others skilled in the art to best utilize the technology in various embodiments and with various modifications as are suited to the particular use contemplated.

What is claimed is:

1. A non-volatile data storage device comprising:
   a substrate;
   a three dimensional arrangement of non-volatile storage elements (NYSE's) positioned above the substrate, where each non-volatile storage element has respective first and second terminals provided for electrical operating of the respective non-volatile storage element;
   a plurality of word lines connected to the non-volatile storage elements;
   a plurality of pairs of adjacent but isolated-from-one-another, vertically oriented bit lines extending vertically into the three dimensional arrangement of non-volatile storage elements, the bit lines of each pair connecting to corresponding non-volatile storage elements, the adjacent but isolated-from-one-another, vertically oriented bit lines of each pair having at least one of an insulative material and an air gap interposed between them;
   a three dimensional arrangement of vertically oriented, bit line selector devices, each of the bit line selector devices having a respective output terminal, a respective control terminal, and a respective input terminal, the bit line selector devices being positioned below the non-volatile storage elements and above the substrate, the output terminals of the bit line selector devices being respectively coupled to respective ones of the vertically oriented bit lines;
   a plurality of group select lines extending between and coupling to control terminals of respective groups of the bit line select devices; and
   a plurality of spaced apart global bit lines positioned below the bit line selector devices and above the substrate;
   wherein a bit line connection point of one of the vertically oriented bit lines to a corresponding non-volatile storage element in a given layer of the three dimensional arrangement of non-volatile storage elements is not a shared connection point that is also a bit line connection point to another non-volatile storage element in the same layer of the three dimensional arrangement of non-volatile storage elements.

2. The non-volatile data storage system of claim 1, wherein:
   at least one of the global bit lines includes a shared portion that couples to or defines the input terminals of a pair of adjacent, but at least partly split apart from one another ones of the bit line selector devices of different selectable groups, the at least partial splitting apart between the two adjacent bit line selector devices of the pair being present at their output and their control terminals such that when one of the two adjacent, but at least partly split apart vertically oriented bit line selector devices of the pair is activated by its corresponding group select line, the other of the pair of bit line selector devices can remain deactivated and not coupling a voltage present on the shared portion of the global bit line to its respective output terminal and to its respective vertically oriented bit line.

3. The non-volatile data storage system of claim 1, wherein:
   the group select lines are provided as pairs wherein a respective two members in each respective pair of select lines are relatively close to one another while adjacent ones of the pairs are farther spaced apart one from the next.

4. The non-volatile data storage system of claim 1, wherein:
   the bit lines are organized in rows and the group select lines operate as row select lines for selecting among the rows of bit lines.

5. The non-volatile storage system of claim 1, wherein:
   the adjacent ones of the vertically oriented bit line selector devices each comprise only one transistor.

6. The non-volatile storage system of claim 5, wherein:
   the one transistor of each vertically oriented bit line selector device includes a respective output terminal, input terminal and control terminal; and
   the respective transistor input terminals in the adjacent ones of the vertically oriented bit line selector devices are at least partially merged while the respective transistor output terminals are isolated from one another.

7. The non-volatile data storage system of claim 1, wherein:
   each vertically oriented bit line has opposed first and second sidewalls where the first sidewall provides connections to corresponding ones of the non-volatile storage elements of the bit line and where the second sidewall does not provide connections.

8. The non-volatile data storage system of claim 7, wherein:
   the respective second sidewall of each vertically oriented bit line is covered by an insulator.

9. The non-volatile data storage system of claim 8, wherein:
   the insulator covering the second sidewall of each vertically oriented bit line extends down to also cover the output terminal of the corresponding vertically oriented, bit line selector device.

10. The non-volatile data storage system of claim 7, wherein:
    respective second sidewalls of pairs of adjacent and vertically oriented bit lines face each other.

11. The non-volatile data storage system of claim 10, wherein:
    an insulator is disposed between the respective facing second sidewalls of pairs of adjacent vertically oriented bit lines and the insulator extends down to be interposed at least between the output terminals of the corresponding vertically oriented, bit line selector devices of those bit lines.

12. The non-volatile data storage system of claim 1, wherein:
    the non-volatile storage elements are variable resistance memory elements.

13. The non-volatile data storage system of claim 1, wherein:
- the substrate comprises electronic elements monolithically integrated therein and defining control circuitry for operating the non-volatile storage elements that are disposed above the substrate; and
- at least part of the control circuitry for operating the non-volatile storage elements is disposed under the non-volatile storage elements.

* * * * *